(12) United States Patent
Kawamura et al.

(10) Patent No.: US 12,010,878 B2
(45) Date of Patent: Jun. 11, 2024

(54) DISPLAY DEVICE

(71) Applicant: Japan Display Inc., Tokyo (JP)

(72) Inventors: Shinichi Kawamura, Tokyo (JP); Nobuo Imai, Tokyo (JP); Hiroshi Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/495,815

(22) Filed: Oct. 27, 2023

(65) Prior Publication Data

US 2024/0074248 A1    Feb. 29, 2024

Related U.S. Application Data

(63) Continuation of application No. 18/343,759, filed on Jun. 29, 2023, now Pat. No. 11,844,246.

(30) Foreign Application Priority Data

Jun. 29, 2022  (JP) .................. 2022-104784

(51) Int. Cl.
| | | |
|---|---|---|
| *H01L 29/08* | (2006.01) | |
| *H10K 59/122* | (2023.01) | |
| *H10K 59/80* | (2023.01) | |
| *H10K 71/20* | (2023.01) | |
| *H10K 102/00* | (2023.01) | |

(52) U.S. Cl.
CPC ....... *H10K 59/122* (2023.02); *H10K 59/8051* (2023.02); *H10K 59/8052* (2023.02); *H10K 71/231* (2023.02); *H10K 2102/351* (2023.02)

(58) Field of Classification Search
CPC ............. H10K 59/122; H10K 59/8052; H10K 59/8051; H10K 2102/351; H10K 71/00
USPC .......................................... 257/40
See application file for complete search history.

(56) References Cited

FOREIGN PATENT DOCUMENTS

CN           117042508 A   * 11/2023   ......... H10K 59/1201

* cited by examiner

*Primary Examiner* — Phuc T Dang
(74) *Attorney, Agent, or Firm* — XSENSUS LLP

(57) ABSTRACT

According to one embodiment, a display device comprises a first lower electrode, a rib including a first pixel aperture, a partition including a lower portion on the rib and an upper portion protruding from a side surface of the lower portion, a first upper electrode, and a first organic layer between the first lower electrode and the first upper electrode. The lower portion includes a bottom layer and a stem layer on the bottom layer. The bottom layer is formed of a material which has a smaller etching rate to a mixed acid containing phosphoric acid, nitric acid, and acetic acid than the stem layer and which is conductive.

25 Claims, 23 Drawing Sheets

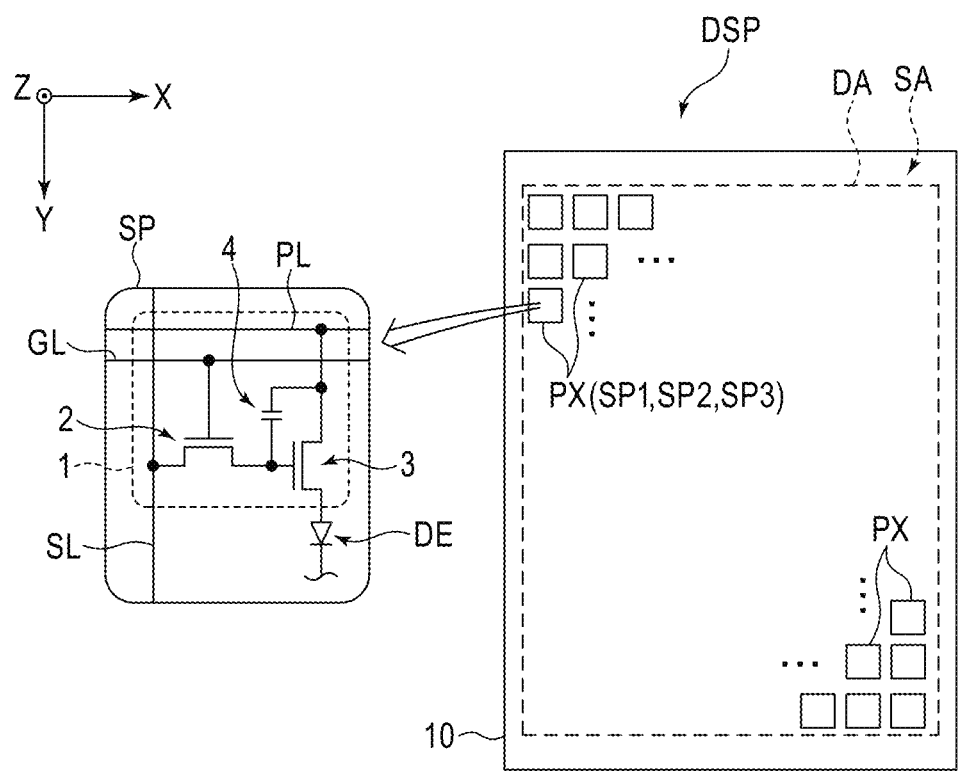
F I G. 1

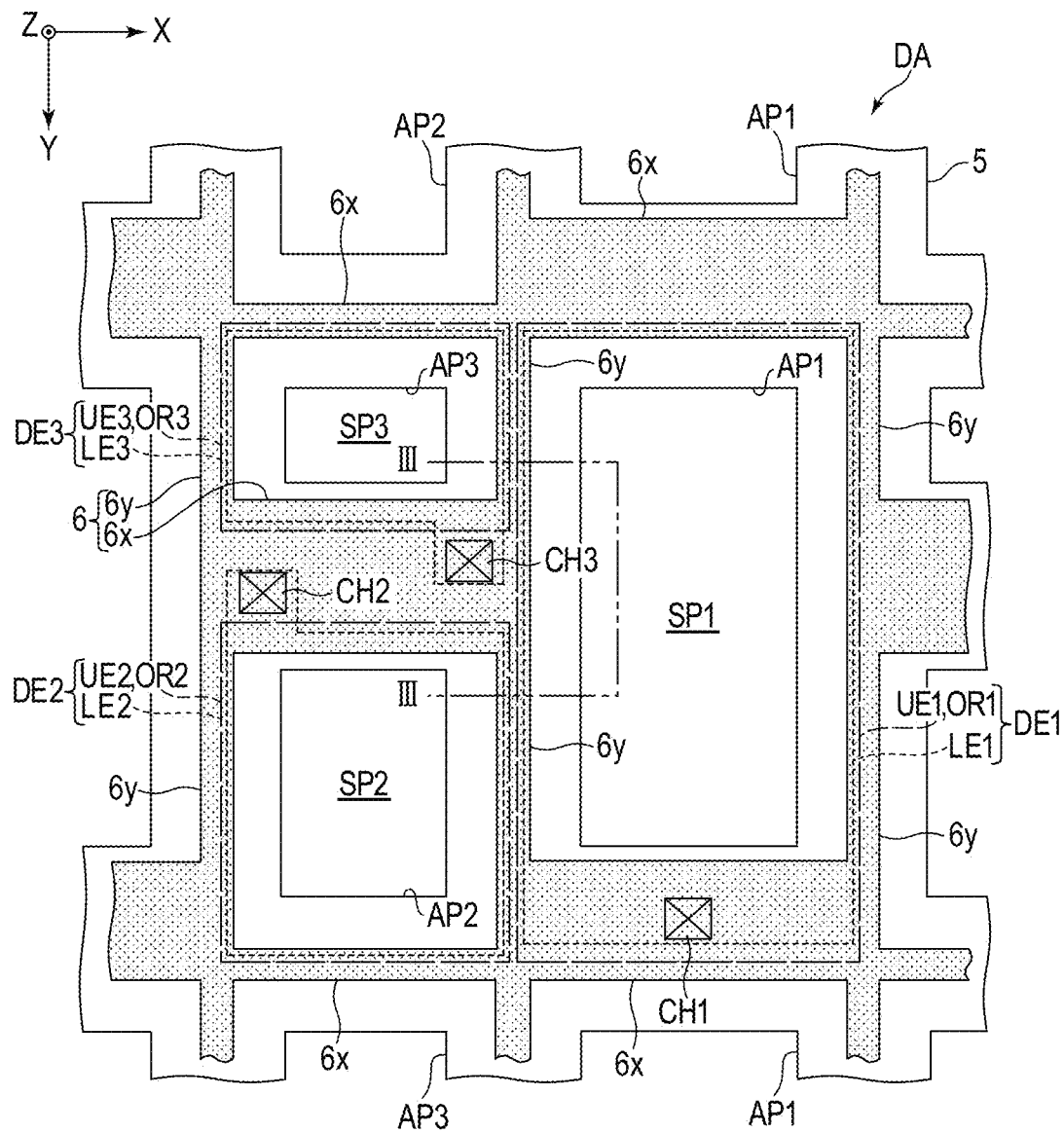
F I G. 2

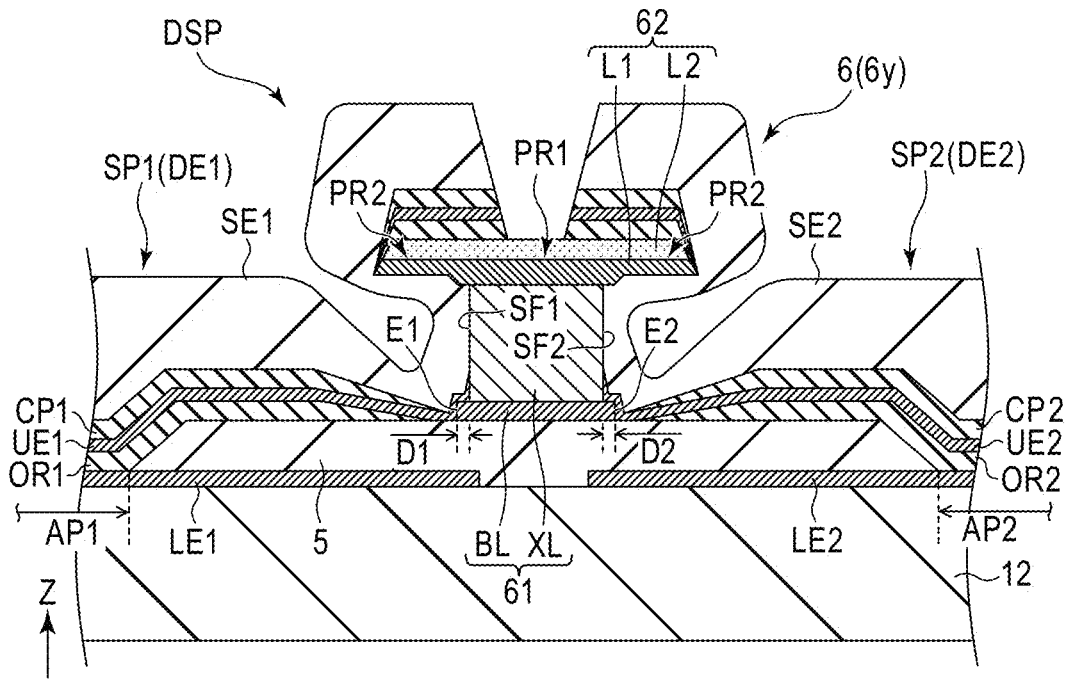
F I G. 28
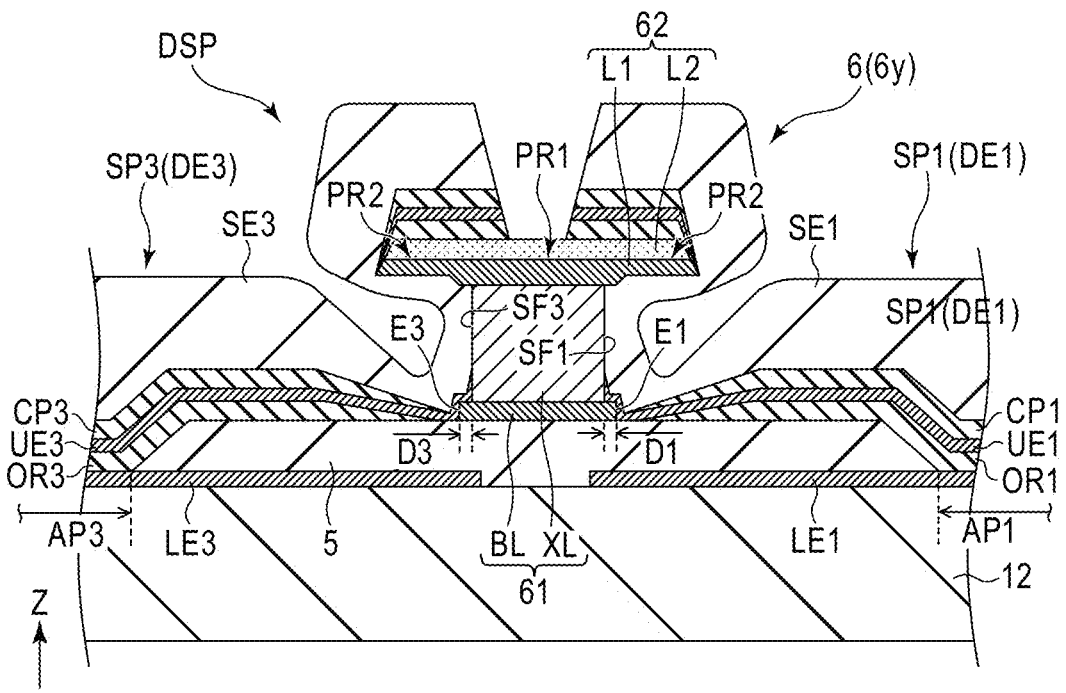
F I G. 29

DISPLAY DEVICE

CROSS-REFERENCE TO RELATED APPLICATIONS

This application is a continuation Application of U.S. application Ser. No. 18/343,759, filed Jun. 29, 2023, U.S. Pat. No. 11,844,246, which claims the benefit of priority from Japanese Patent Application No. 2022-104784, filed Jun. 29, 2022, the entire contents of each are incorporated herein by reference.

FIELD

Embodiments described herein relate generally to a display device.

BACKGROUND

Recently, display devices with organic light emitting diodes (OLEDs) applied thereto as display elements have been put into practical use. This display device comprises a lower electrode, an organic layer covering the lower electrode, and an upper electrode covering the organic layer.

A technique of improving reliability is required in manufacturing the above display device.

BRIEF DESCRIPTION OF THE DRAWINGS

FIG. 1 is a view showing a configuration example of a display device of a first embodiment.

FIG. 2 is a view showing an example of a layout of sub-pixels.

FIG. 28 is a schematic cross-sectional view showing an example of a display device of a third embodiment.

FIG. 29 is a schematic cross-sectional view showing an example of the display device of the third embodiment.

DETAILED DESCRIPTION

Figure 3:
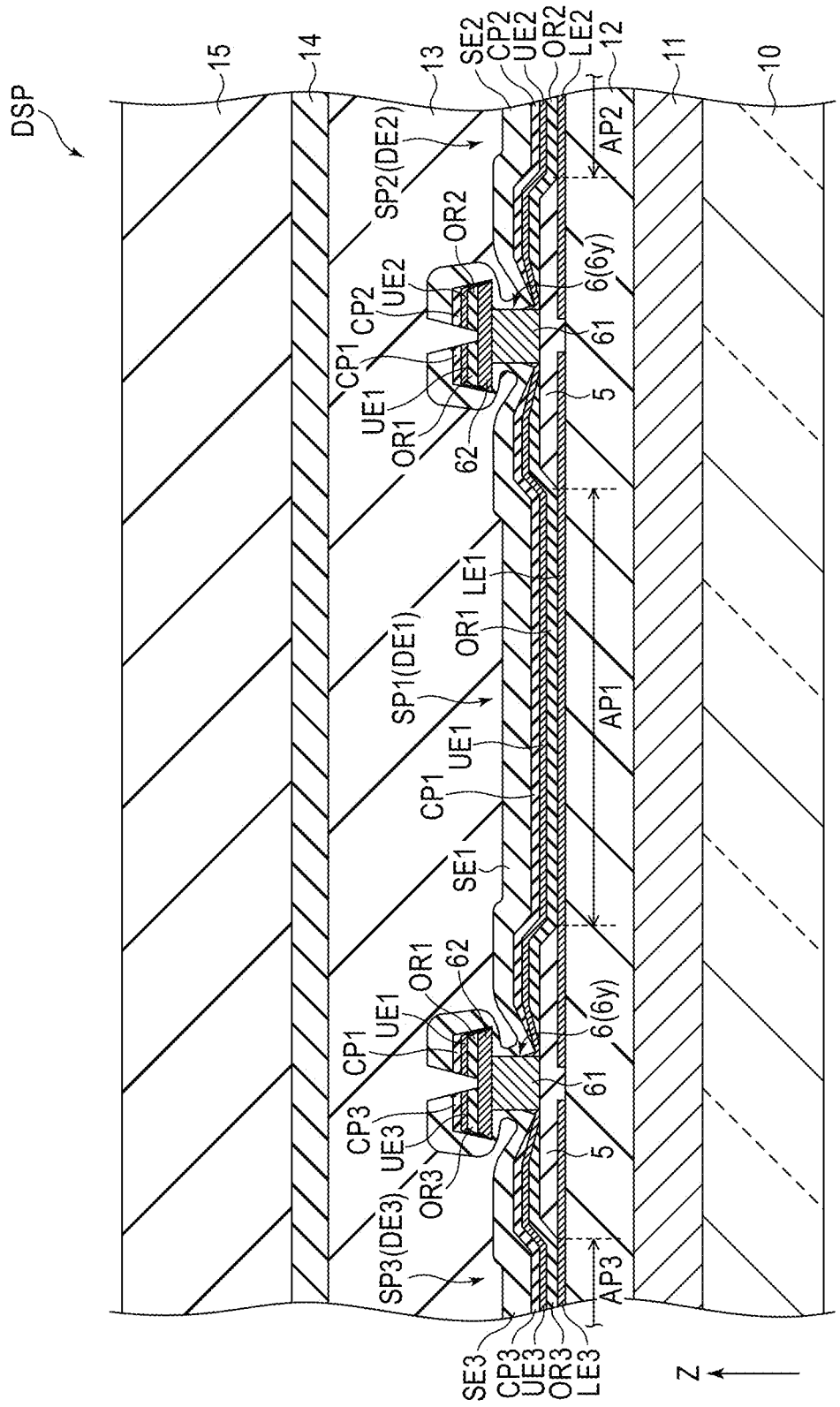
FIG. 3 is a schematic cross-sectional view showing the display device along line III-III in FIG. 2.

In general, according to one embodiment, a display device comprises: a first lower electrode; a rib including a first pixel aperture overlapping with the first lower electrode; a partition including a lower portion arranged on the rib and an upper portion protruding from a side surface of the lower portion; a first upper electrode opposed to the first lower electrode; and a first organic layer located between the first lower electrode and the first upper electrode, contacting with the first lower electrode through the first pixel aperture, and emitting light in accordance with a potential difference between the first lower electrode and the first upper electrode. The lower portion includes a bottom layer contacting with the first upper electrode and a stem layer arranged on the bottom layer. The bottom layer is formed of a material which has a smaller etching rate to a mixed acid containing phosphoric acid, nitric acid, and acetic acid than the stem layer and which is conductive.

According to another viewpoint of the embodiment, the display device comprises: a first lower electrode and a second lower electrode; a rib including a first pixel aperture overlapping with the first lower electrode and a second pixel aperture overlapping with the second lower electrode; a partition including a lower portion arranged on the rib between the first pixel aperture and the second pixel aperture, and an upper portion protruding from a side surface of the lower portion; a first upper electrode opposed to the first lower electrode; a second upper electrode opposed to the second lower electrode; a first organic layer located between the first lower electrode and the first upper electrode, contacting with the first lower electrode through the first pixel aperture, and emitting light in accordance with a potential difference between the first lower electrode and the first upper electrode; and a second organic layer located between the second lower electrode and the second upper electrode, contacting with the second lower electrode through the second pixel aperture, and emitting light in accordance with a potential difference between the second lower electrode and the second upper electrode. The rib is formed of silicon oxide or silicon oxynitride. The lower portion includes a conductive bottom layer and a stem layer which is formed of a metal and is arranged on the bottom layer. The bottom layer includes a first end on a side of the first pixel aperture and a second end on a side of the second pixel aperture. The stem layer includes a first side surface on a side of the first pixel aperture and a second side surface on a side of the second pixel aperture. The first end protrudes from the first side surface, and the second end protrudes from the second side surface.

According to yet another viewpoint of the embodiment, a display device comprising: a first lower electrode and a second lower electrode; a rib including a first pixel aperture overlapping with the first lower electrode and a second pixel aperture overlapping with the second lower electrode; a partition including a lower portion arranged on the rib and an upper portion protruding from a side surface of the lower portion; a first upper electrode opposed to the first lower electrode; a second upper electrode opposed to the second lower electrode; a first organic layer located between the first lower electrode and the first upper electrode, contacting with the first lower electrode through the first pixel aperture, and emitting light in accordance with a potential difference between the first lower electrode and the first upper electrode; and a second organic layer located between the second lower electrode and the second upper electrode, contacting with the second lower electrode through the second pixel aperture, and emitting light in accordance with a potential difference between the second lower electrode and the second upper electrode. The partition is arranged between the first pixel aperture and the second pixel aperture. The upper portion includes a first layer and a second layer covering the first layer. The first layer is formed of titanium, titanium nitride, tungsten, or a tungsten alloy. The second layer is formed of ITO, IZO or IGZO. The lower portion includes a conductive bottom layer and a stem layer which is formed of aluminum or an aluminum alloy and is arranged on the bottom layer. The bottom layer includes a first end on a side of the first pixel aperture and a second end on a side of the second pixel aperture. The stem layer includes a first side surface on a side of the first pixel aperture and a second side surface on a side of the second pixel aperture. The first end protrudes from the first side surface, and the second end protrudes from the second side surface.

According to yet another viewpoint of the embodiment, a display device manufacturing method includes: forming a first lower electrode and a second lower electrode; forming a rib including a first pixel aperture overlapping with the first lower electrode and a second pixel aperture overlapping with the second lower electrode; forming a partition including a lower portion arranged on the rib and an upper portion protruding from a side surface of the lower portion; forming a first organic layer contacting with the first lower electrode through the first pixel aperture; forming a first upper electrode covering the first organic layer; forming a first resist above a first display element including the first lower electrode, the first organic layer, and the first upper electrode; removing a portion of the first upper electrode, which is exposed from the first resist, by wet etching using a mixed acid containing phosphoric acid, nitric acid, and acetic acid; removing a portion of the first organic layer, which is exposed from the first resist, by dry etching; forming a second organic layer contacting with the second lower electrode through the second pixel aperture; and forming a second upper electrode covering the second organic layer. The lower portion includes a bottom layer contacting with the first upper electrode and the second upper electrode and a stem layer arranged on the bottom layer. The bottom layer is formed of a material which has a smaller etching rate to the mixed acid than the stem layer and which is conductive.

Several embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, an X-axis, a Y-axis and a Z-axis orthogonal to each other are described to facilitate understanding as needed. A direction along the X-axis is referred to as a first direction, a direction along the Y-axis is referred to as a second direction, and a direction along the Z-axis is referred to as a third direction. Viewing various elements parallel to the third direction Z is referred to as plan view.

The display device of each of the embodiments is an organic electroluminescent display device comprising an organic light emitting diode (OLED) as a display element, and can be mounted on televisions, personal computers, vehicle-mounted devices, tablet terminals, smartphones, cell phone terminals, and the like.

First Embodiment

FIG. 1 is a view showing a configuration example of a display device DSP of a first embodiment. The display device DSP includes a display area DA where images are displayed and a surrounding area SA around the display area DA, on an insulating substrate 10. The substrate 10 may be glass or a flexible resin film.

In the present embodiment, the shape of the substrate 10 in plan view is a rectangular shape. However, the shape of the substrate 10 in plan view is not limited to a rectangular shape, but may be any other shape such as a square, a circle or an ellipse.

The display area DA includes a plurality of pixels PX arrayed in a matrix in the first direction X and the second direction Y. Each of the pixels PX includes a plurality of sub-pixels SP. In one example, the pixel PX includes a blue first sub-pixel SP1, a green second sub-pixel SP2, and a red third sub-pixel SP3. The pixel PX may include sub-pixels SP of other colors such as a white color together with the sub-pixels SP1, SP2, and SP3 or instead of any of the sub-pixels SP1, SP2, and SP3.

The sub-pixel SP comprises a pixel circuit 1 and a display element DE driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to the display element DE. The display element DE is an organic light emitting diode (OLED) serving as a light emitting element.

The configuration of the pixel circuit 1 is not limited to the example shown in the figure. For example, the pixel circuit 1 may comprise more thin-film transistors and capacitors.

FIG. 2 is a view showing an example of a layout of the sub-pixels SP1, SP2, and SP3. In the example of FIG. 2, the first sub-pixel SP1 and the third sub-pixel SP3 are arranged in the first direction X. The first sub-pixel SP1 and the second sub-pixel SP2 are arranged in the first direction X. Furthermore, the second sub-pixel SP2 and the third sub-pixel SP3 are arranged in the second direction Y.

When the sub-pixels SP1, SP2, and SP3 are arranged in such a layout, a row in which the sub-pixels SP2 and SP3 are alternately arranged in the second direction Y and a row in which a plurality of first sub-pixels SP1 are repeatedly arranged in the second direction Y are formed in the display area DA. These rows are alternately arranged in the first direction X.

The layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 includes a first pixel aperture AP1 in the first sub-pixel SP1, a second pixel aperture AP2 in the second sub-pixel SP2, and a third pixel aperture AP3 in the third sub-pixel SP3.

In the example shown in FIG. 2, the area of the first pixel aperture AP1 is larger than that of the second pixel aperture AP2. The area of the first pixel aperture AP1 is larger than that of the third pixel aperture AP3. Furthermore, the area of the third pixel aperture AP3 is smaller than that of the second pixel aperture AP2.

The partition 6 is arranged at a boundary of adjacent sub-pixels SP and overlaps with the rib 5 in plan view. The partition 6 includes a plurality of first partitions 6x extending in the first direction X and a plurality of second partitions 6y extending in the second direction Y. The plurality of first partitions 6x are arranged between the pixel apertures AP2 and AP3 adjacent in the second direction Y and between two first pixel apertures AP1 adjacent in the second direction Y. The second partitions 6y are arranged between the pixel apertures AP1 and AP2 adjacent in the first direction X and between the pixel apertures AP1 and AP3 adjacent in the first direction X.

In the example in FIG. 2, the first partitions 6x and the second partitions 6y are connected to each other. Thus, the partition 6 has a grating pattern surrounding the pixel apertures AP1, AP2, and AP3 as a whole. The partition 6 is considered to include apertures at the sub-pixels SP1, SP2, and SP3, similarly to the rib 5.

The first sub-pixel SP1 comprises a first lower electrode LE1, a first upper electrode UE1, and a first organic layer OR1 each overlapping with the first pixel aperture AP1. The second sub-pixel SP2 comprises a second lower electrode LE2, a second upper electrode UE2, and a second organic layer OR2 each overlapping with the second pixel aperture AP2. The third sub-pixel SP3 comprises a third lower electrode LE3, a third upper electrode UE3, and a third organic layer OR3 each overlapping with the third pixel aperture AP3.

The first lower electrode LE1, the first upper electrode UE1, and the first organic layer OR1 constitute a first display element DE1 of the first sub-pixel SP1. The second lower electrode LE2, the second upper electrode UE2, and the second organic layer OR2 constitute a second display element DE2 of the second sub-pixel SP2. The third lower electrode LE3, the third upper electrode UE3, and the third organic layer OR3 constitute a third display element DE3 of the third sub-pixel SP3. The display elements DE1, DE2, and DE3 may include a cap layer (optical adjustment layer) to be described below.

The first lower electrode LE1 is connected to the pixel circuit 1 (see FIG. 1) of the first sub-pixel SP1 through a first contact hole CH1. The second lower electrode LE2 is connected to the pixel circuit 1 of the second sub-pixel SP2 through a second contact hole CH2. The third lower electrode LE3 is connected to the pixel circuit 1 of the third sub-pixel SP3 through a third contact hole CH3.

In the example shown in FIG. 2, the contact holes CH2 and CH3 entirely overlap with the first partition 6x between the pixel apertures AP2 and AP3 adjacent to each other in the second direction Y. In addition, the first contact hole CH1 entirely overlaps with the first partition 6x between two first pixel apertures AP1 adjacent to each other in the second direction Y. As the other example, at least several parts of the contact holes CH1, CH2, and CH3 may not overlap with the first partition 6x.

FIG. 3 is a schematic cross-sectional view showing the display device DSP along line III-III in FIG. 2. A circuit layer 11 is arranged on the above-described substrate 10. The circuit layer 11 includes various circuits and lines such as the pixel circuits 1, the scanning lines GL, the signal lines SL and the power lines PL shown in FIG. 1.

The circuit layer 11 is covered with an organic insulating layer 12. The organic insulating layer 12 functions as a planarization film for planarizing uneven parts generated by the circuit layer 11. Although not shown in the cross-section of FIG. 3, the above contact holes CH1, CH2, and CH3 are provided in the organic insulating layer 12.

The lower electrodes LE1, LE2, and LE3 are arranged on the organic insulating layer 12. The rib 5 is arranged on the organic insulating layer 12 and the lower electrodes LE1, LE 2, and LE3. End parts of the lower electrodes LE1, LE2, and LE3 are covered with the rib 5.

The partition 6 includes a lower portion 61 which is conductive and arranged on the rib 5 and an upper portion 62 arranged on the lower portion 61. The upper portion 62 has a width greater than the lower portion 61. As a result, both end portions of the upper portion 62 protrude beyond the side surfaces of the lower portion 61 in FIG. 3. The shape of the partition 6 may also be referred to as an overhanging shape.

The first organic layer OR1 covers the first lower electrode LE1 through the first pixel aperture AP1. The first upper electrode UE1 covers the first organic layer OR1 and is opposed to the first lower electrode LE1. The second organic layer OR2 covers the second lower electrode LE2 through the second pixel aperture AP2. The second upper electrode UE2 covers the second organic layer OR2 and is opposed to the second lower electrode LE2. The third organic layer OR3 covers the third lower electrode LE3 through the third pixel aperture AP3. The third upper electrode UE3 covers the third organic layer OR3 and is opposed to the third lower electrode LE3.

In the example shown in FIG. 3, a first cap layer CP1 is arranged on the first upper electrode UE1, a second cap layer CP2 is arranged on the second upper electrode UE2, and a third cap layer CP3 is arranged on the third upper electrode UE3. The cap layers CP1, CP2, and CP3 adjust optical properties of the light emitted from the organic layers OR1, OR2, and OR3, respectively.

Several parts of the first organic layer OR1, the first upper electrode UE1, and the first cap layer CP1 are located on the upper portion 62. The parts are separated from the other parts of the first organic layer OR1, the first upper electrode UE1, and the first cap layer CP1 (i.e., the parts constituting the first display element DE1). Similarly, several parts of the second organic layer OR2, the second upper electrode UE2, and the second cap layer CP2 are located on the upper portion 62, and the parts are separated from the other parts of the second organic layer OR2, the second upper electrode UE2, and the second cap layer CP2 (i.e., the parts constituting the second display element DE2). Furthermore, several parts of the third organic layer OR3, the third upper electrode UE3, and the third cap layer CP3 are located on the upper portion 62, and the parts are separated from the other parts of the third organic layer OR3, the third upper electrode UE3, and the third cap layer CP3 (i.e., the parts constituting the third display element DE3).

A first sealing layer SE1 is arranged in the first sub-pixel SP1, a second sealing layer SE2 is arranged in the second sub-pixel SP2, and a third sealing layer SE3 is arranged in the third sub-pixel SP3. The first sealing layer SE1 continuously covers the first cap layer CP1, and the partition 6 around the first sub-pixel SP1. The second sealing layer SE2 continuously covers the second cap layer CP2, and the partition 6 around the second sub-pixel SP2. The third sealing layer SE3 continuously covers the third cap layer CP3, and the partition 6 around the third sub-pixel SP3.

End parts (peripheral parts) of the sealing layers SE1, SE2, and SE3 are located above the upper portions 62. In the example shown in FIG. 3, the end portions of the sealing layers SE1 and SE2 located above the upper portion 62 of the partition 6 between the sub-pixels SP1 and SP2 are separated from each other, and the end portions of the sealing layers SE1 and SE3 located above the upper portion 62 of the partition 6 between the sub-pixels SP1 and SP3 are separated from each other.

The sealing layers SE1, SE2, and SE3 are covered with a resin layer 13. The resin layer 13 is covered with a sealing layer 14. Furthermore, the sealing layer 14 is covered with a resin layer 15.

The organic insulating layer 12 and the resin layers 13 and 15 are formed of an organic material. The sealing layers 14, SE1, SE2, and SE3 are formed of, for example, an inorganic material such as silicon nitride (SiNx). The sealing layers 14, SE1, SE2, and SE3 may be formed as a single-layer body of any one of silicon oxide (SiOx) and silicon oxynitride (SiON). Alternatively, the sealing layers 14, SE1, SE2, and SE3 may be formed as a stacked-layer body formed of combination of at least two of a silicon nitride layer, a silicon oxide layer, and a silicon oxynitride layer.

The lower electrodes LE1, LE2, and LE3 include, for example, an intermediate layer formed of silver (Ag) and a pair of conductive oxide layers covering each of upper and lower surfaces of the intermediate layer. Each of the conductive oxide layers can be formed of, for example, a transparent conductive oxide such as indium tin oxide (ITO), indium zinc oxide (IZO), or indium gallium zinc oxide (IGZO).

The upper electrodes UE1, UE2, and UE3 are formed of, for example, a metallic material such as an alloy (MgAg) of magnesium and silver. For example, the lower electrodes LE1, LE2, and LE3 correspond to anodes, and the upper electrodes UE1, UE2, and UE3 correspond to cathodes.

The cap layers CP1, CP2, and CP3 are formed of, for example, a multilayer body formed of a plurality of transparent thin films. The multilayer body may include a thin film formed of an inorganic material and a thin film formed of an organic material, as the plurality of thin films. In addition, the plurality of thin films have refractive indexes different from each other. The materials of the thin films constituting the multilayer body are different from the materials of the upper electrodes UE1, UE2, and UE3 and different from the materials of the sealing layers SE1, SE2, and SE3. The cap layers CP1, CP2, and CP3 may be omitted.

A common voltage is supplied to the partition 6. This common voltage is supplied to each of the upper electrodes UE1, UE2, and UE3 that are in contact with the side surfaces of the lower portion 61. A pixel voltage is supplied to the lower electrodes LE1, LE2, and LE3 through the pixel circuits 1 included in the respective sub-pixels SP1, SP2, and SP3.

Each of the organic layers OR1, OR2, and OR3 includes, for example, a structure in which a hole-injection layer, a hole-transport layer, an electron blocking layer, a light emitting layer, a hole blocking layer, an electron-transport layer, and an electron-injection layer are stacked in this order in the third direction Z. The first organic layer OR1 is formed to be thinner than the second organic layer OR2, and the second organic layer OR2 is formed to be thinner than the third organic layer OR. However, the organic layers OR1, OR2, and OR3 may be equivalent in thickness.

When a potential difference is formed between the first lower electrode LE1 and the first upper electrode UE1, the light emitting layer of the first organic layer OR1 emits light of the blue wavelength range. When a potential difference is formed between the second lower electrode LE2 and the second upper electrode UE2, the light emitting layer of the second organic layer OR2 emits light of the green wavelength range. When a potential difference is formed between the third lower electrode LE3 and the third upper electrode UE3, the light emitting layer of the third organic layer OR3 emits light of the red wavelength range.

Figure 4:
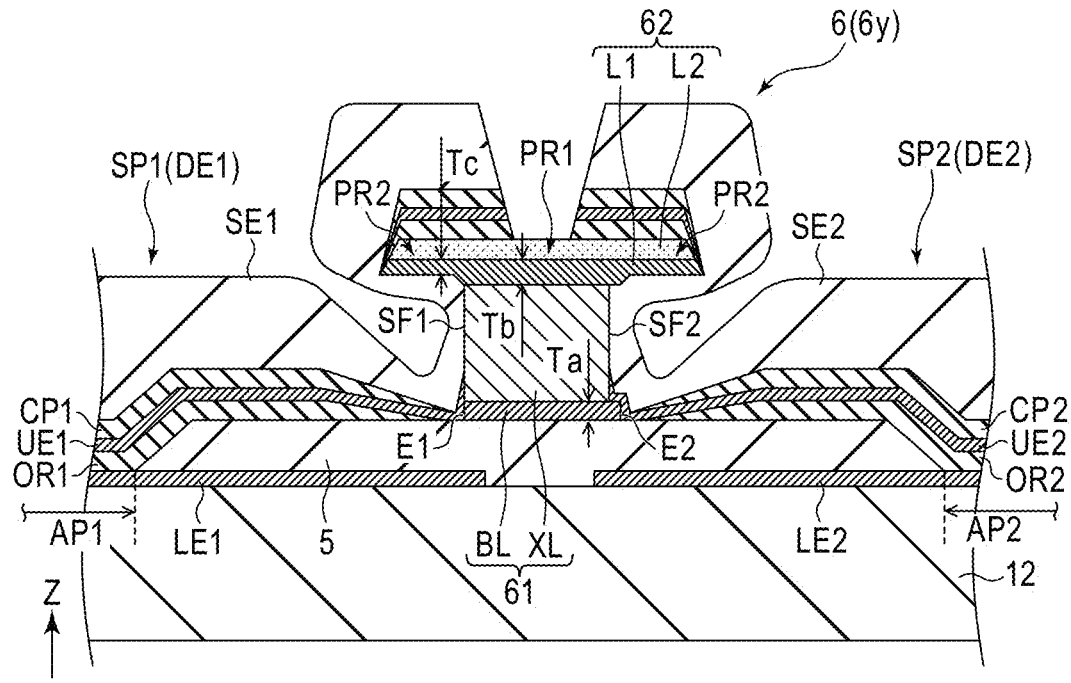
FIG. 4 is an enlarged schematic cross-sectional view showing a partition between first and second pixel apertures and its vicinity shown in FIG. 3.
Figure 5:
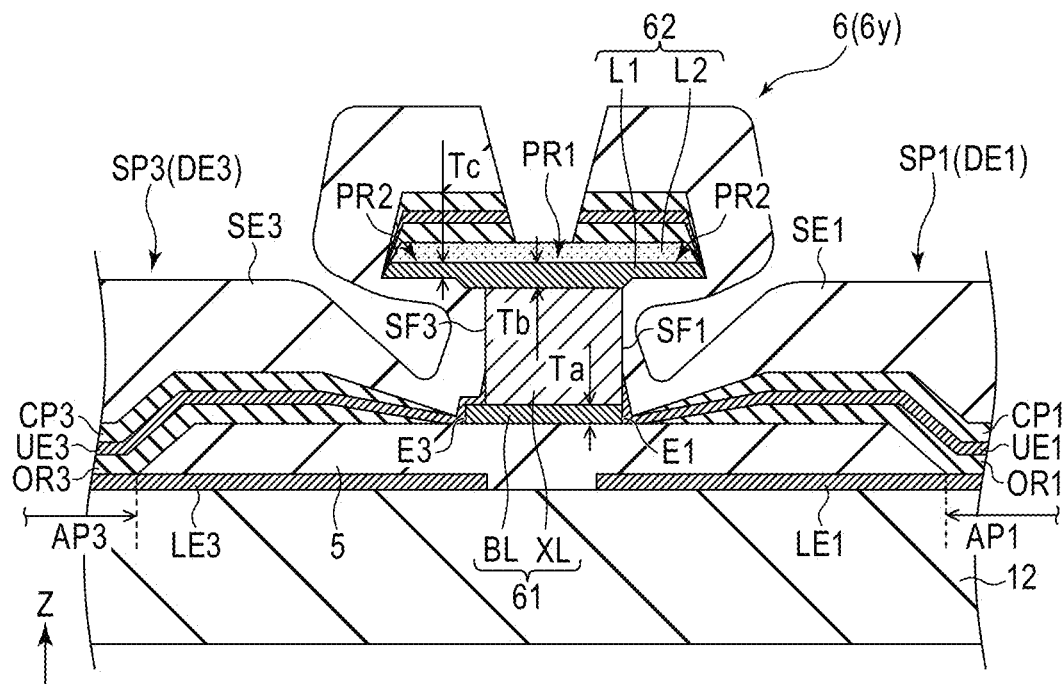
FIG. 5 is an enlarged schematic cross-sectional view showing a partition between first and third pixel apertures and its vicinity shown in FIG. 3.

FIG. 4 is an enlarged schematic cross-sectional view showing the partition 6 between the pixel apertures AP1 and AP2 and its vicinity shown in FIG. 3. FIG. 5 is an enlarged schematic cross-sectional view showing the partition 6 between the pixel apertures AP1 and AP3 and its vicinity shown in FIG. 3. In the figures, the substrate 10, the circuit layer 11, the resin layer 13, the sealing layer 14, and the resin layer 15 are omitted.

The lower portion 61 of the partition 6 includes a conductive bottom layer BL arranged on the rib 5 and a conductive stem layer XL arranged on the bottom layer BL. The bottom layer BL is formed to be thinner than the stem layer XL. For example, the thickness of the bottom layer BL is one third or less of the thickness of the stem layer XL.

As shown in FIG. 4, the bottom layer BL includes a first end portion E1 on the side of the first pixel aperture AP1 and a second end portion E2 on the side of the second pixel aperture AP2. Furthermore, as shown in FIG. 5, the bottom layer BL includes a third end portion E3 on the side of the third pixel aperture AP3. When the partition 6 has a planar shape shown in FIG. 2, the first end portion E1 surrounds the first pixel aperture AP1, the second end portion E2 surrounds the second pixel aperture AP2, and the third end portion E3 surrounds the third pixel aperture AP3.

As shown in FIG. 4, the stem layer XL includes a first side surface SF1 on the side of the first pixel aperture AP1 and a second side surface SF2 on the side of the second pixel aperture AP2. Furthermore, as shown in FIG. 5, the stem layer XL includes a third side surface SF3 on the side of the third pixel aperture AP3. When the partition 6 has a planar shape shown in FIG. 2, the first side surface SF1 surrounds the first pixel aperture AP1, the second side surface SF2 surrounds the second pixel aperture AP2, and the third side surface SF3 surrounds the third pixel aperture AP3.

In the examples of FIG. 4 and FIG. 5, the first end portion E1 is aligned with the first side surface SF1 in the third direction Z. In other words, the first end portion E1 and the first side surface SF1 form a substantially continuous plane.

On the other hand, as shown in FIG. 4, the second end portion E2 protrudes in the width direction of the partition 6 further than the second side surface SF2. In addition, as shown in FIG. 5, the third end portion E3 protrudes in the width direction of the partition 6 further than the third side surface SF3. In the present embodiment, the protrusion length of the third end portion E3 from the third side surface SF3 is larger than the protrusion length of the second end portion E2 from the second side surface SF2.

As shown in FIG. 4 and FIG. 5, the first upper electrode UE1 is in contact with the first end portion E1 and the first side surface SF1. As shown in FIG. 4, the second upper electrode UE2 is in contact with the second end portion E2 and the second side surface SF2. The second upper electrode UE2 entirely covers the portion of the bottom layer BL which protrudes from the second side surface SF2. As shown in FIG. 5, the third upper electrode UE3 is in contact with the third end portion E3 and the third side surface SF3. The third upper electrode UE3 entirely covers the portion of the bottom layer BL which protrudes from the third side surface SF3.

The upper portion 62 of the partition 6 protrudes from the side surfaces SF1, SF2, and SF3 in the width direction of the partition 6. The upper portion 62 protrudes from the ends E1, E2, and E3 in the width direction of the partition 6.

In the examples of FIG. 4 and FIG. 5, the upper portion 62 includes a first layer L1 arranged on the stem layer XL and a second layer L2 covering the first layer L1. The second layer L2 has an entirely uniform thickness.

The first layer L1 includes a first portion PR1 and a second portion PR2 that are different in thickness. The first portion PR1 is provided at a position overlapping with the bottom layer BL or the stem layer XL in the third direction Z. The second portion PR2 is provided at a position of the first layer L1, which does not overlap with the bottom layer BL and the stem layer XL in the third direction Z. In the examples of FIG. 4 and FIG. 5, the upper surface of the first layer L1 is flat. On the other hand, the lower surface of the first layer L1 protrudes downward at the first portion PR1.

The upper portion 62 is formed to be thicker than the bottom layer BL. The bottom layer BL has thickness Ta, the first portion PR1 has thickness Tb, and the second portion PR2 has thickness Tc. In the present embodiment, the thickness Tb is greater than the thickness Ta (Ta<Tb). In other words, the first layer L1 is formed to be thicker than the bottom layer BL at least in the first portion PR1. In addition, the thickness Tc is smaller than the thickness Tb (Tc<Tb). The thicknesses Ta and Tc are, for example, equivalent to each other.

The stem layer XL is formed of, for example, aluminum (AL). The stem layer XL may be formed of an aluminum alloy. For example, aluminum-neodymium (AlNd), aluminum-yttrium (AlY), aluminum-silicon (AlSi) and the like can be used as the aluminum alloy.

The bottom layer BL is formed of a material which has a smaller etching rate to a mixed acid containing phosphoric acid, nitric acid, and acetic acid than the stem layer XL and which is conductive. This mixed acid is an etchant used in the wet etching to be described below with reference to FIG. 22.

More specifically, the bottom layer BL is formed of titanium (Ti) or titanium nitride (TiN). As another example, the bottom layer BL may be formed of tungsten (W) or a tungsten alloy. For example, molybdenum-tungsten (MoW) can be used as the tungsten alloy.

Titanium is easily oxidized, and its oxide is an insulator. On the other hand, titanium nitride is conductive. Therefore, when the bottom layer BL is formed of titanium nitride, oxidation of the bottom layer BL is suppressed and a good conductivity with the upper electrodes UE1, UE1, and UE3 can be ensured.

The upper portion 62 is formed of a material whose etching rate to the above mixed acid is smaller than that of the stem layer XL. Furthermore, the second layer L2 is formed of a material whose etching rate to dry etching using fluorine gas is smaller than that of the first layer L1 and the bottom layer BL. This fluorine gas is an etching gas used in the dry etching to be described below with reference to FIG. 17.

More specifically, the first layer L1 is formed of, for example, titanium or titanium nitride. As another example, the first layer L1 may be formed of tungsten or a tungsten alloy. For example, molybdenum-tungsten can be used as a tungsten alloy. From the viewpoint of manufacturing efficiency, the bottom layer BL and the first layer L1 are desirably formed of the same material. The second layer L2 can be formed of, for example, a conductive oxide such as ITO, IZO or IGZO.

The rib 5 is formed of, for example, a material having an excellent resistance to the above fluorinated gases, such as silicon oxide or silicon oxynitride. The material of the rib 5 is desirably an inorganic material, such as silicon nitride other than the above.

The structure of the partition 6 and its vicinity is not limited to the examples shown in FIG. 4 and FIG. 5. Several modified examples will be described below.

Figure 6:
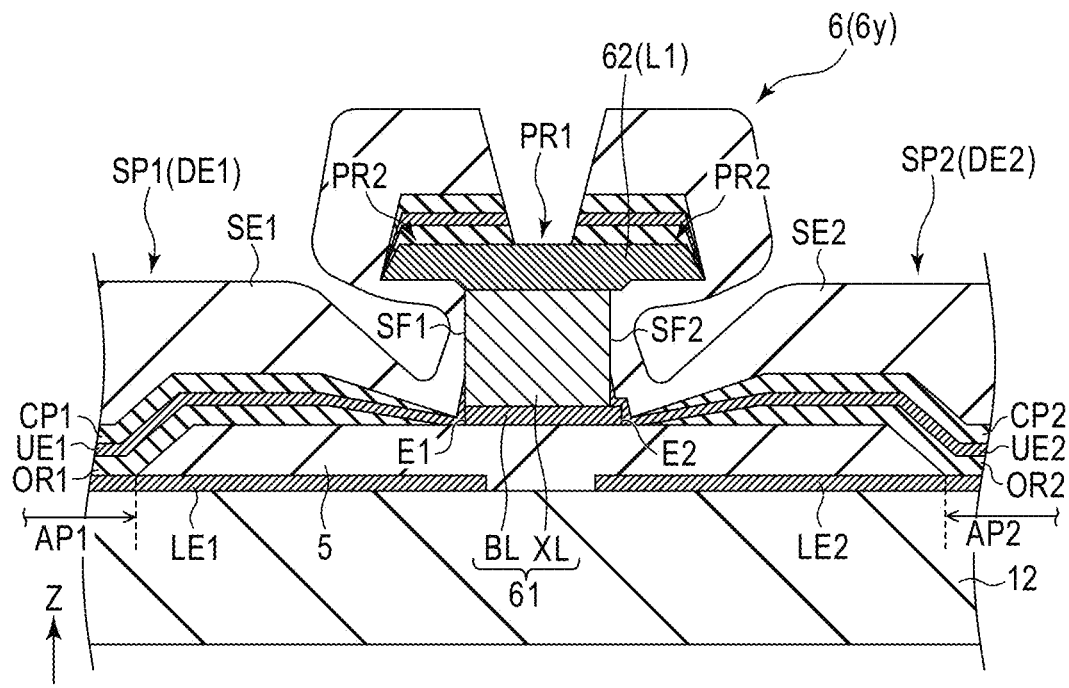
FIG. 6 is a schematic cross-sectional view showing the partition and its vicinity of a first modified example.

FIG. 6 is a schematic cross-sectional view showing the partition 6 and its vicinity of a first modified example. In the partition 6 shown in FIG. 6, the upper portion 62 does not include the second layer L2. In other words, the upper portion 62 has a single-layer structure of the first layer L1. The materials which can be applied to the first layer L1 have been described above.

Figure 7:
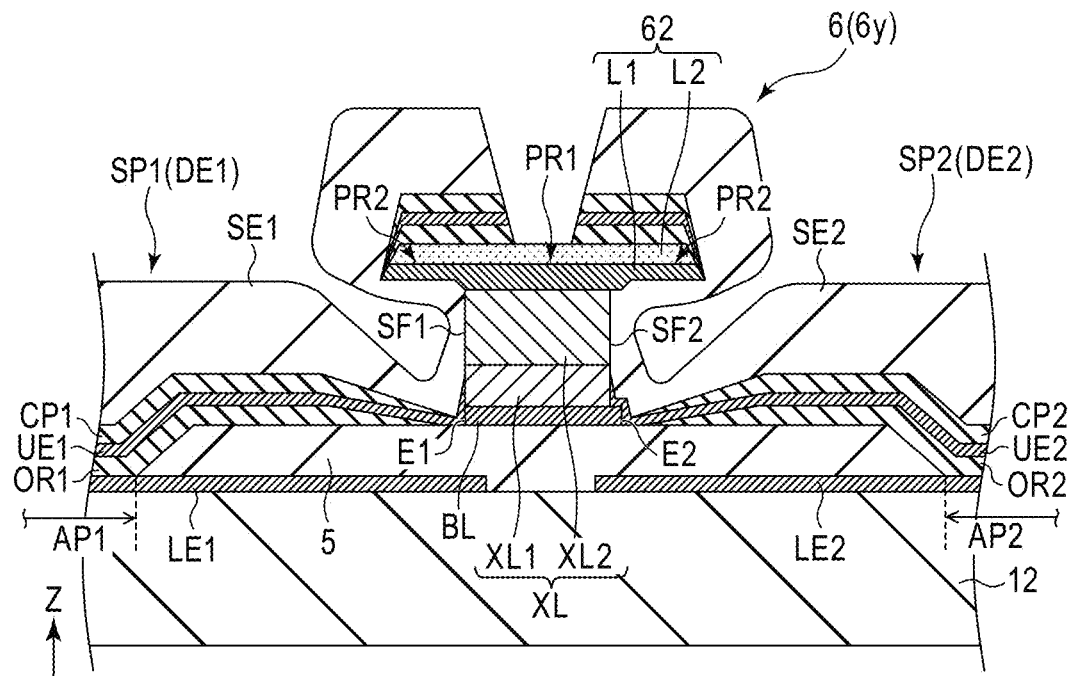
FIG. 7 is a schematic cross-sectional view showing the partition and its vicinity of a second modified example.

FIG. 7 is a schematic cross-sectional view showing the partition 6 and its vicinity of a second modified example. In the partition 6 shown in FIG. 7, the stem layer XL has a stacked structure of a first stem layer XL1 and a second stem layer XL2. For example, one of the stem layers XL1 and XL2 is formed of aluminum, and the other is formed of an aluminum alloy. The stem layers XL1 and XL2 may be formed of different types of aluminum alloys. For example, aluminum-neodymium, aluminum-yttrium, and aluminum-silicon can be used as aluminum alloys. The stem layer XL may have a stacked structure of three or more layers.

Figure 8:
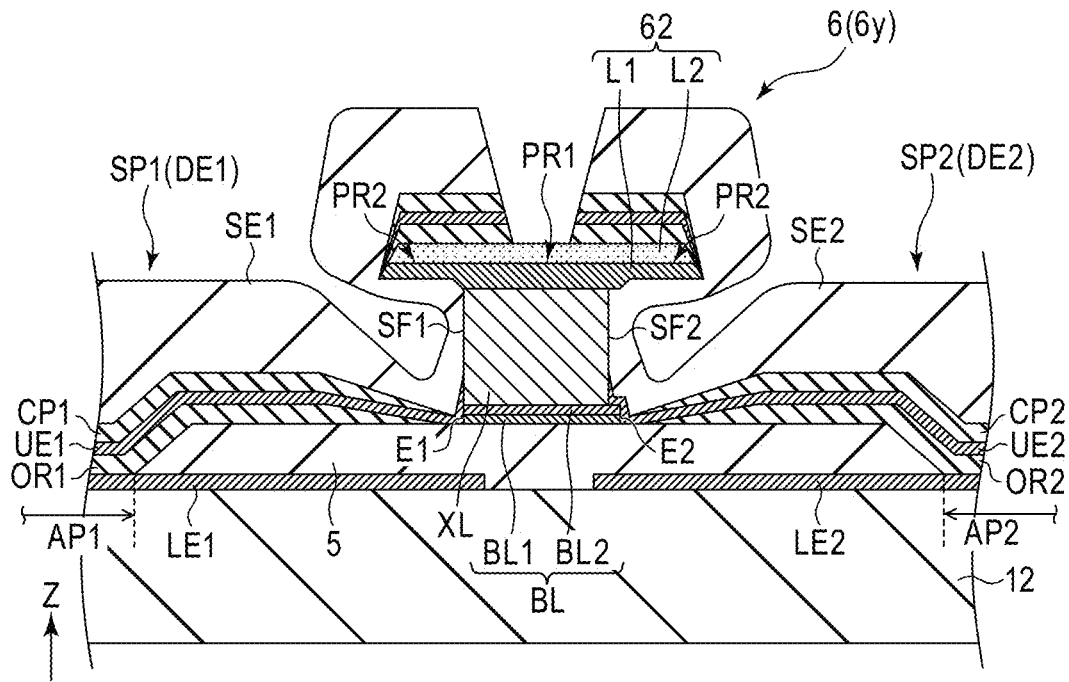
FIG. 8 is a schematic cross-sectional view showing the partition and its vicinity of a third modified example.

FIG. 8 is a schematic cross-sectional view showing the partition 6 and its vicinity of a third modified example. In the partition 6 shown in FIG. 8, the bottom layer BL has a stacked structure of a first bottom layer BL1 and a second bottom layer BL2. For example, the bottom layers BL1 and BL2 are formed of two different materials selected from titanium, titanium nitride, tungsten, and tungsten alloys. The bottom layer BL may have a stacked structure of three or more layers.

Figure 9:
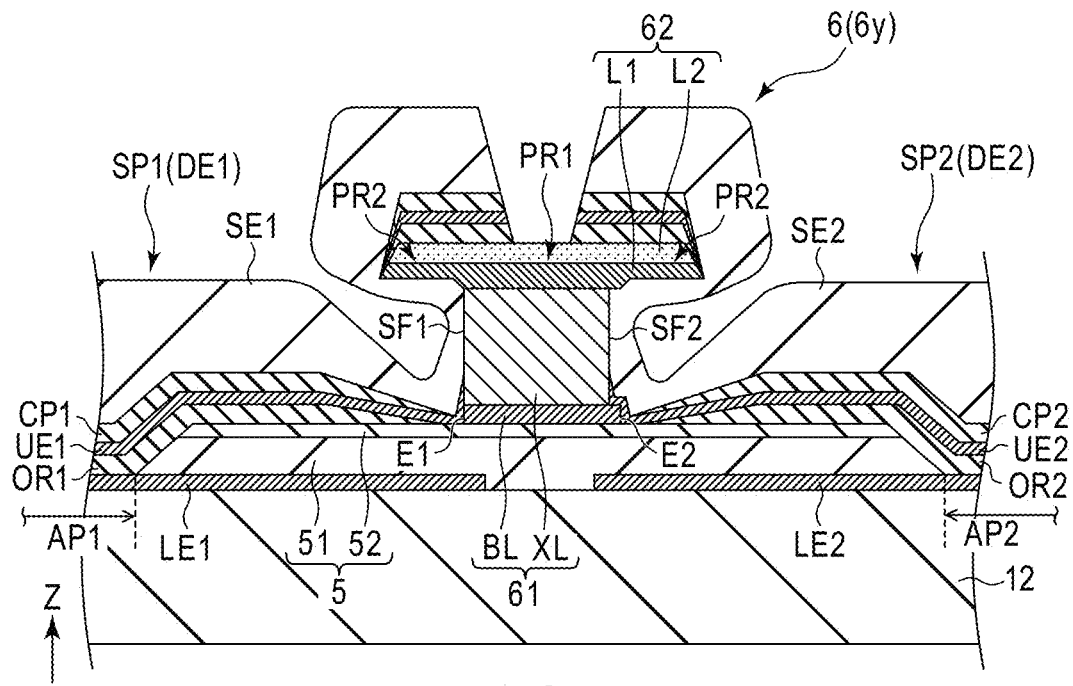
FIG. 9 is a schematic cross-sectional view showing the partition and its vicinity of a fourth modified example.

FIG. 9 is a schematic cross-sectional view showing the partition 6 and its vicinity of a fourth modified example. In FIG. 9, the rib 5 has a stacked structure of a first rib layer 51 and a second rib layer 52. The second rib layer 52 covers the first rib layer 51. For example, the second rib layer 52 is formed of silicon oxide or silicon oxynitride. The first rib layer 51 is formed of one of silicon oxide and silicon oxynitride, which is different from the second rib layer 52, or silicon nitride.

The structures of the bottom layer BL, the stem layer XL, the upper layer 62, and the rib 5 shown in FIG. 4 to FIG. 9 described above can be combined appropriately.

Next, the manufacturing method of the display device DSP will be described using the case where the display device DSP has the structures shown in FIG. 4 and FIG. 5 as an example. The manufacturing method described below can also be modified appropriately and applied to the manufacturing of the display device DSP having the structures shown in FIG. 6 to FIG. 9.

Figure 10:
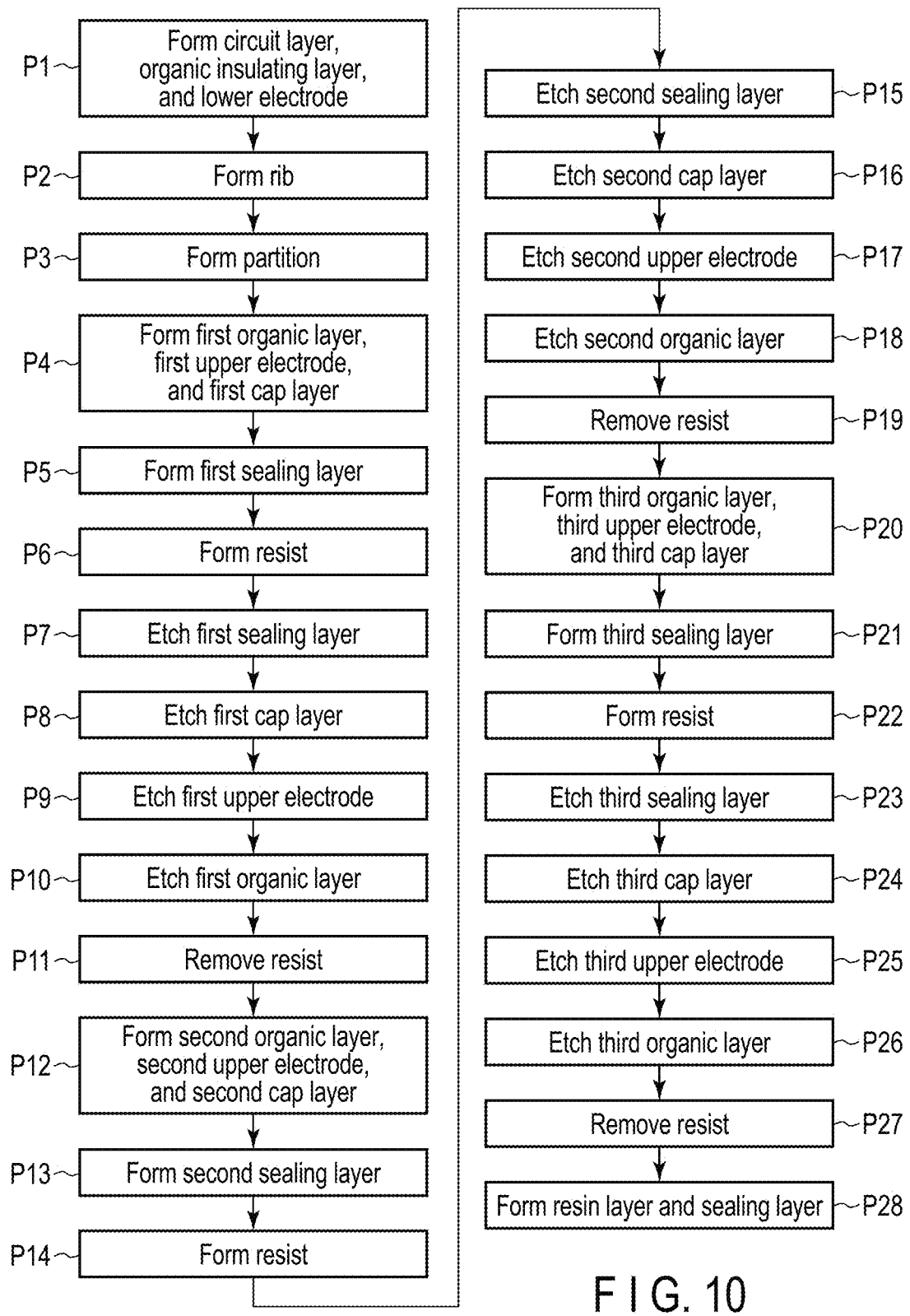
FIG. 10 is a flowchart showing an example of a method of manufacturing the display device of the first embodiment.
Figure 11:
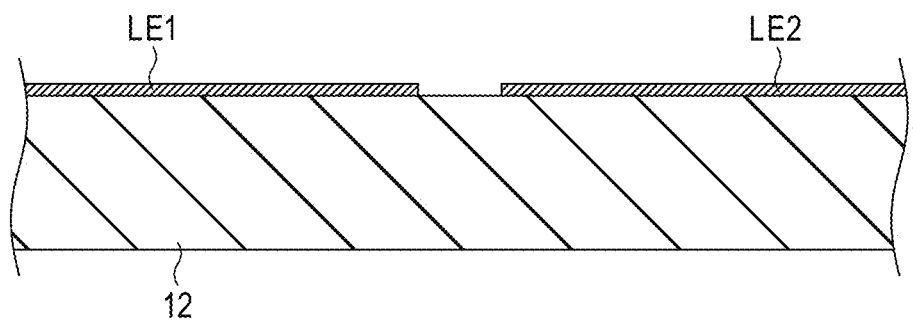
FIG. 11 is a schematic cross-sectional view showing a part of processes of manufacturing the display device of the first embodiment.

FIG. 10 is a flowchart showing an example of a method of manufacturing the display device DSP. FIG. 11 to FIG. 25 are schematic cross-sectional views showing several parts of manufacturing processes of the display device DSP. In FIG. 11 to FIG. 25, the substrate 10 and the circuit layer 11 are omitted. In manufacturing the display device DSP, the circuit layer 11, the organic insulating layer 12, and the lower electrodes LE1, LE2, and LE3 are first formed on the substrate 10 (process P1). FIG. 11 shows a state of the substrate subjected to process P1.

Figure 12:
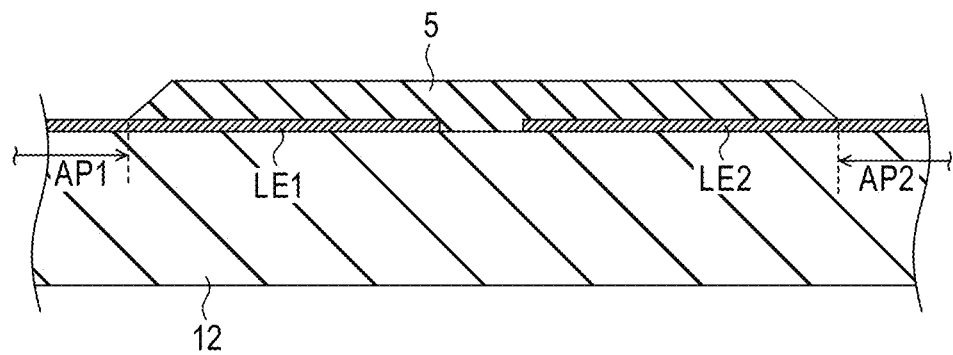
FIG. 12 is a schematic cross-sectional view showing a manufacturing process following FIG. 11.

Furthermore, the rib 5 including the pixel apertures AP1, AP2, and AP3 is formed as shown in FIG. 12 (process P2). After that, the partition 6 is formed on the rib 5 in the manner shown in FIG. 13 to FIG. 17 (process P3).

Figure 13:
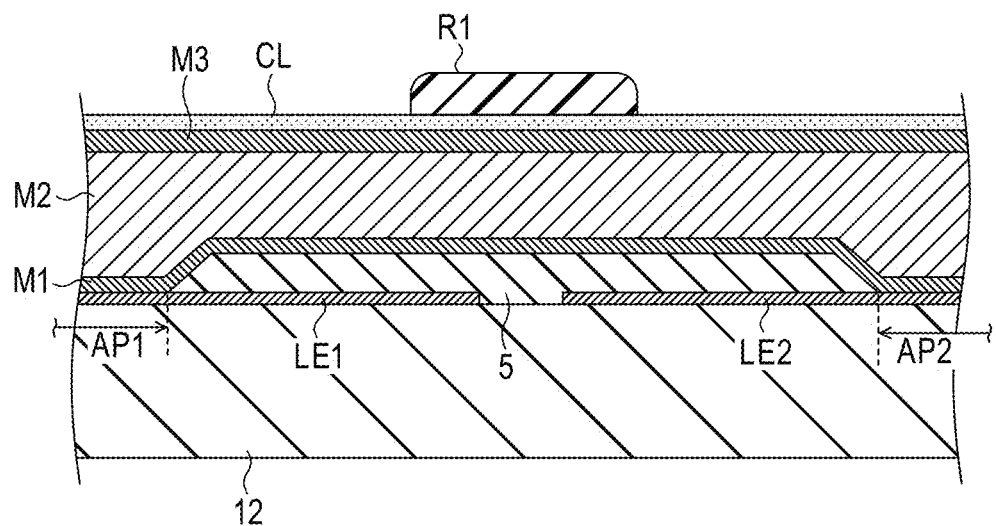
FIG. 13 is a schematic cross-sectional view showing a manufacturing process FIG. 12.

In forming the partition 6, as shown in FIG. 13, the first metal layer M1 serving as the base of the bottom layer BL, the second metal layer M2 serving as the base of the stem layer XL, the third metal layer M3 serving as the base of the first layer L1, and the conductive oxide layer CL serving as the base of the second layer L2 are formed in order on the entire substrate. Furthermore, the resist R1 is formed on the conductive oxide layer CL. This resist R1 is patterned in the shape of the partition 6 shown in FIG. 2. The materials of the metallic layers M1, M2, and M3 and the conductive oxide layer CL are the same as the above-described materials of the bottom layer BL, the stem layer XL, the first layer L1, and the second layer L2.

The first metal layer M1 covers the ribs 5 and also covers the lower electrodes LE1, LE2, and LE3 through the pixel apertures AP1, AP2, and AP3. As described above, the lower electrodes LE1, LE2, and LE3 include an intermediate layer formed of silver and a pair of conductive oxide layers covering upper and lower surfaces of the intermediate layer, respectively. If the first metal layer M1 is not provided, the stem layer XL containing aluminum or aluminum alloys comes into contact with the conductive oxide layers of the lower electrodes LE1, LE2, and LE3, and the conductive oxide layers can be degraded (reduced). The first metal layer M1 interposed between the lower electrodes LE1, LE2, and LE3 and the stem layer XL has a role of suppressing such degradation.

Figure 14:
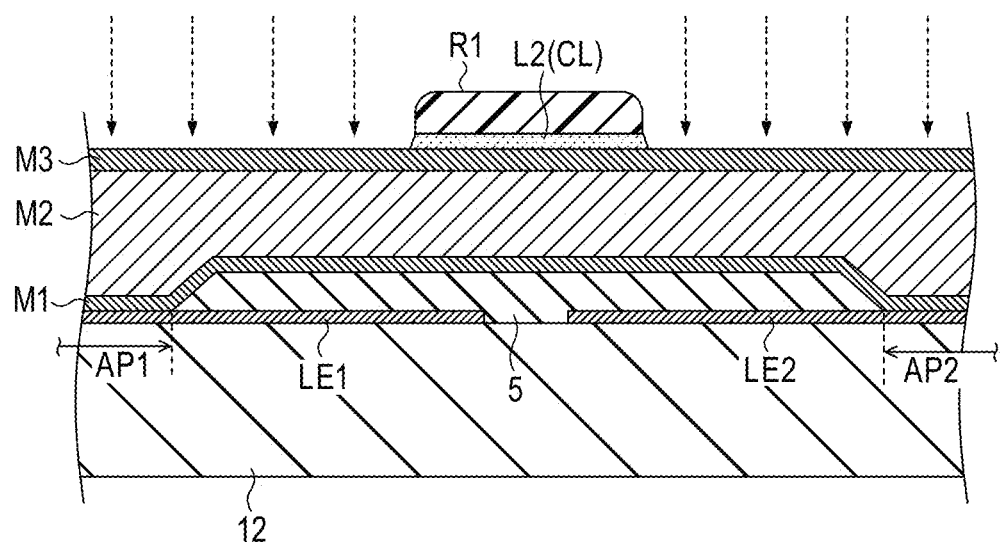
FIG. 14 is a schematic cross-sectional view showing a manufacturing process following FIG. 13.

Next, as shown in FIG. 14, the portion of the conductive oxide layer CL which is exposed from the resist R1 is removed by wet etching. The second layer L2 is thereby formed. The third metal layer M3 serves as a stopper for this wet etching.

Figure 15:
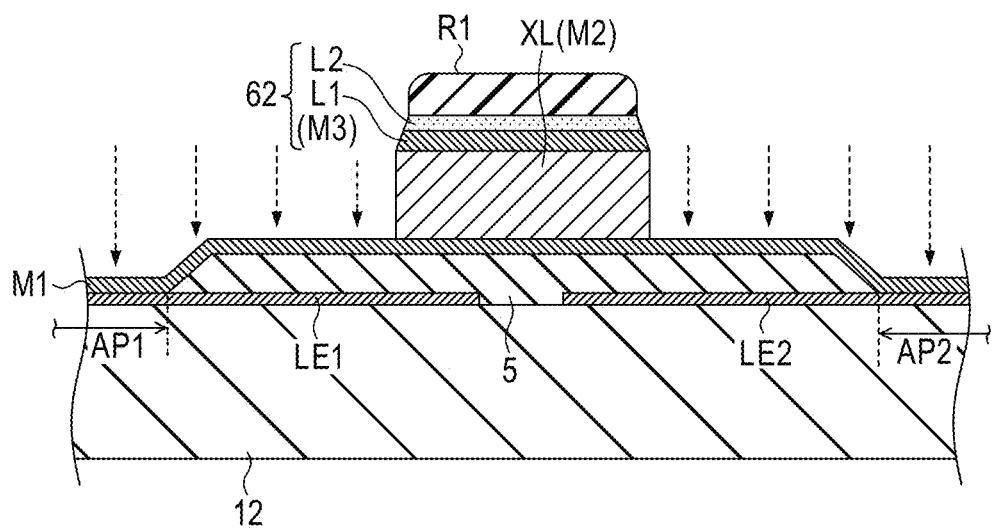
FIG. 15 is a schematic cross-sectional view showing a manufacturing process following FIG. 14.

Next, as shown in FIG. 15, the portions of the second metal layer M2 and the third metal layer M3, which are exposed from the resist R1, are removed by anisotropic dry etching. Thus, the upper portion 62 including the first layer L1 and the second layer L2 is formed and the stem layer XL is also formed. An etching gas containing chlorine (chlorine gas) is used for this dry etching. The first metal layer M1 serves as a stopper for this dry etching.

Figure 16:
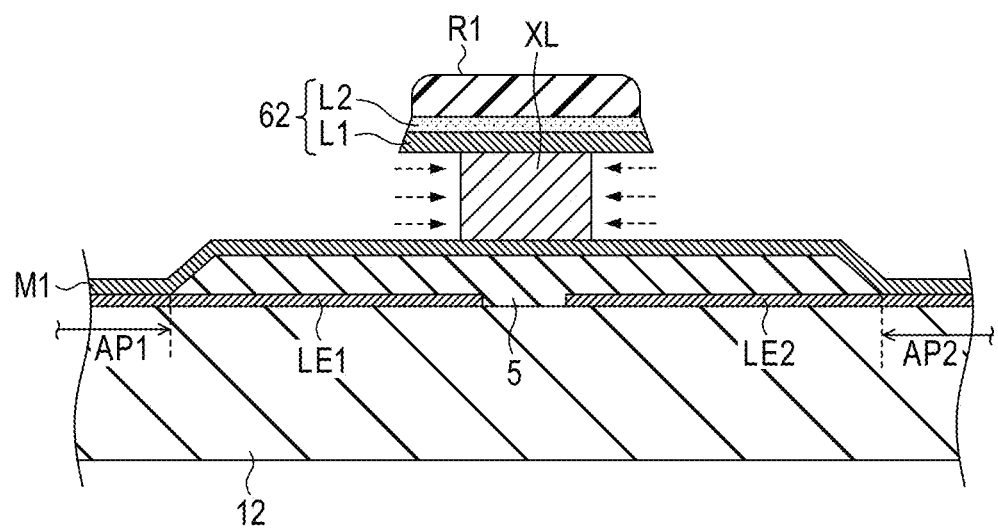
FIG. 16 is a schematic cross-sectional view showing a manufacturing process following FIG. 15.

After that, as shown in FIG. 16, the width of the stem layer XL is made smaller than that of the upper portion 62 by isotropic wet etching. A mixed acid containing phosphoric acid, nitric acid, and acetic acid is used as an etchant for this wet etching. The etching rate of the first metal layer M1 for the mixed acid is sufficiently smaller than that of the stem layer XL for the mixed acid. Therefore, the first metal layer M1 is hardly eroded.

Figure 17:
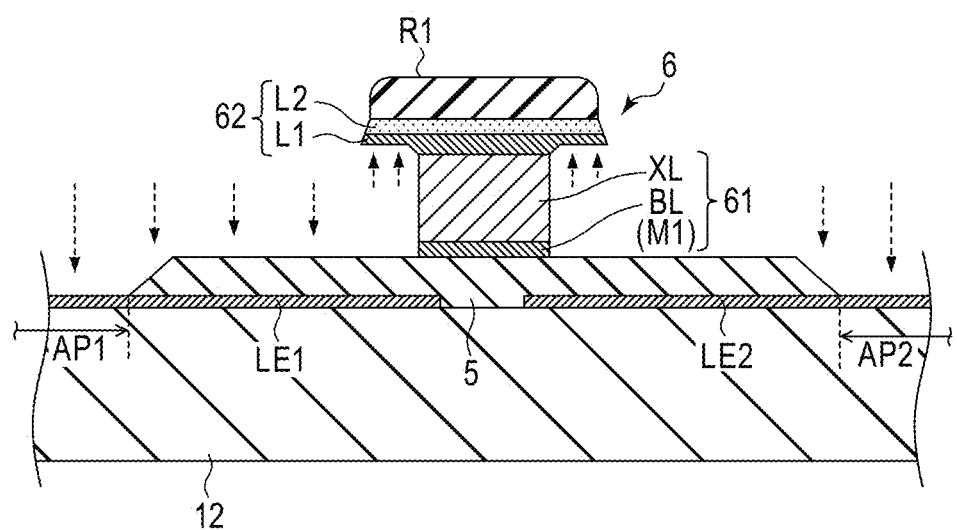
FIG. 17 is a schematic cross-sectional view showing a manufacturing process following FIG. 16.

After the width of the stem layer XL is reduced, the portion of the first metal layer M1, which is exposed from the stem layer XL, is removed by dry etching, as shown in FIG. 17. The lower portion 61 including the bottom layer BL and the stem layer XL is thereby formed. An etching gas containing fluorine (fluorine gas) is used for this dry etching. Examples of fluorinated gases include sulfur hexafluoride ($SF_6$), methane tetrafluoride ($CF_4$), ethane hexafluoride ($C_2F_6$), methane trifluoride ($CHF_3$), and nitrogen trifluoride ($NF_3$). The etching rate of the stem layer XL for the etching gas is sufficiently smaller than that of the first metal layer M1 for the etching gas. Therefore, the stem layer XL is hardly eroded.

When the first layer L1 is formed of the same type of material as the bottom layer BL, the lower surface of the first layer L1 can be mainly eroded by the dry etching as shown in FIG. 17. The second portion PR2 shown in FIG. 4 and FIG. 5 is thereby formed.

If the thickness of the first layer L1 to be subjected to the dry etching is less than or equal to the thickness of the bottom layer BL, the portion of the first layer L1, which is exposed from the stem layer XL, can be lost by the dry etching. In this case, the strength of the partition 6 is reduced. For this reason, the thickness of the first layer L1 to be subjected to the dry etching (thickness Tb shown in FIG. 4 and FIG. 5) is desirably larger than the thickness of the bottom layer BL (thickness Ta shown in FIG. 4 and FIG. 5).

The second layer L2 formed of a conductive oxide such as ITO has excellent resistance to the dry etching. In other words, the etching rate of the second layer L2 for the dry etching is smaller than that of the first layer L1 and the bottom layer BL for the dry etching. For this reason, the second layer L2 is not eroded by the dry etching. As a result, even if the first layer L1 is significantly eroded, the shape of the overhung upper portion 62 can be maintained.

When the rib 5 is formed of silicon nitride, the rib 5 can also be eroded by fluorine gas. In contrast, when the rib 5 is formed of silicon oxide or silicon oxynitride, damage to the rib 5 in etching using fluorine-based gases can be suppressed. The same advantage is also achieved when the rib 5 is formed to have a stacked structure of the first rib layer 51 and the second rib layer 52 and the second rib layer 52 is formed of silicon oxide or silicon oxynitride, similarly to the fourth modified example in FIG. 9.

After the partition 6 is formed in the above processes of FIG. 13 to FIG. 17, the resist R1 is removed and processes for forming the display elements DE1, DE2, and DE3 are executed. In the present embodiment, it is assumed that the first display element DE1 is first formed, the second display element DE2 is formed next, and the third display element DE3 is formed last. However, the order of formation of the display elements DE1, DE2, and DE3 is not limited to this example.

Figure 18:
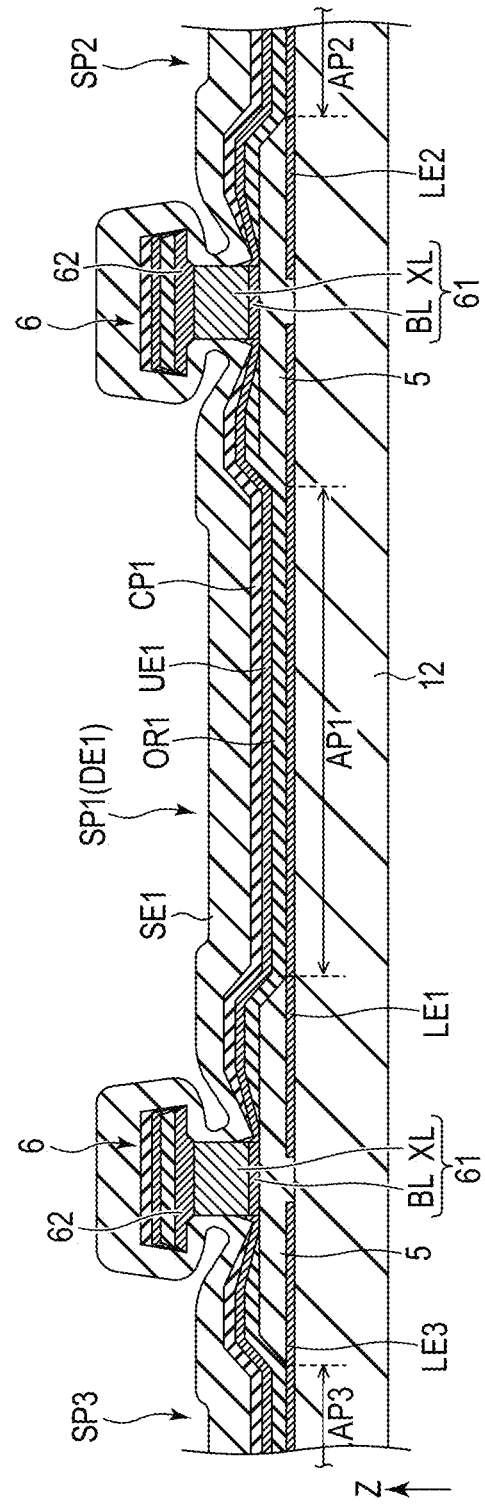
FIG. 18 is a schematic cross-sectional view showing a manufacturing process following FIG. 17.

In forming the first display element DE1, as shown in FIG. 18, the first organic layer OR1 which is in contact with the first lower electrode LE1 through the first pixel aperture AP1, the first upper electrode UE1 which covers the first organic layer OR1, and the first cap layer CP1 which covers the first upper electrode UE1 are first formed in order by vapor deposition (process P4). Furthermore, the first sealing layer SE1 is formed by Chemical Vapor Deposition (CVD) (process P5). The first sealing layer SE1 continuously covers the first display element DE1 including the first organic layer OR1, the first upper electrode UE1 and the first cap layer CP1, and the partition 6.

The first organic layer OR1, the first upper electrode UE1, the first cap layer CP1, and the first sealing layer SE1 are formed in at least the entire display area DA, and are arranged not only in the first sub-pixel SP1 but also in the second sub-pixel SP2 and the third sub-pixel SP3. The first organic layer OR1, the first upper electrode UE1, and the first cap layer CP1 are divided by the overhanging partition 6.

Figure 19:
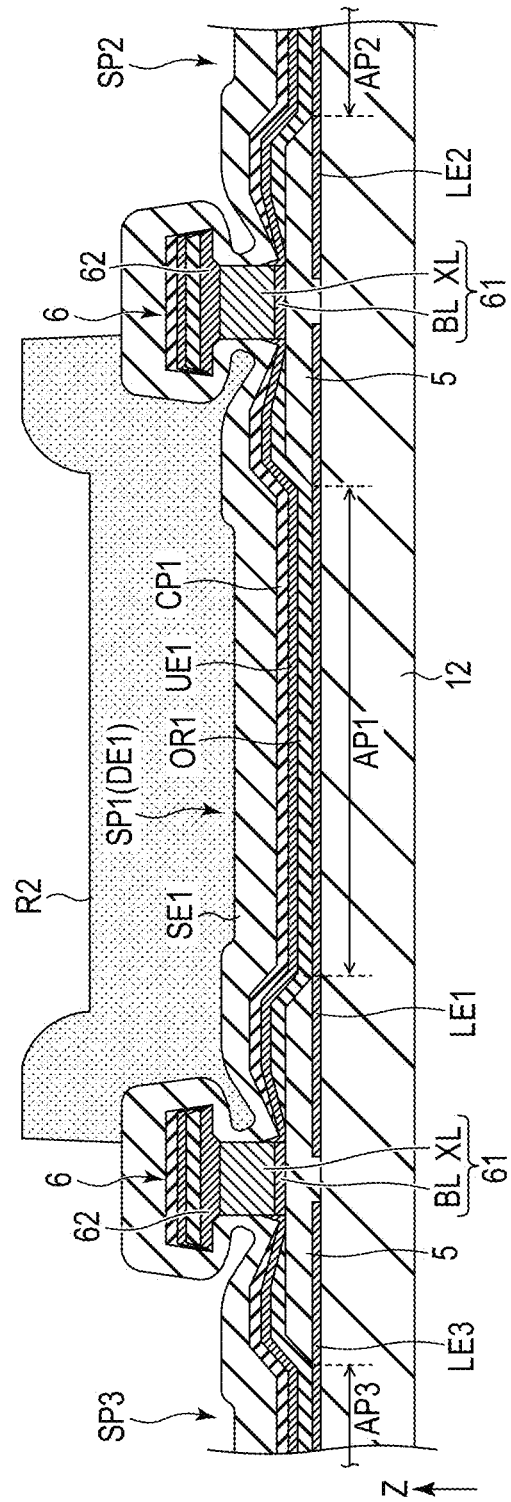
FIG. 19 is a schematic cross-sectional view showing a manufacturing process following FIG. 18.

After process P4, a resist R2 is arranged on the first sealing layer SE1 as shown in FIG. 19 (process P6). The resist R2 is located above the first display element DE1 including the first lower electrode LE1, the first organic layer OR1, the first upper electrode UE1 and the first cap layer CP1, and also covers a part of the partition 6 around the first sub-pixel SP1.

Figure 20:
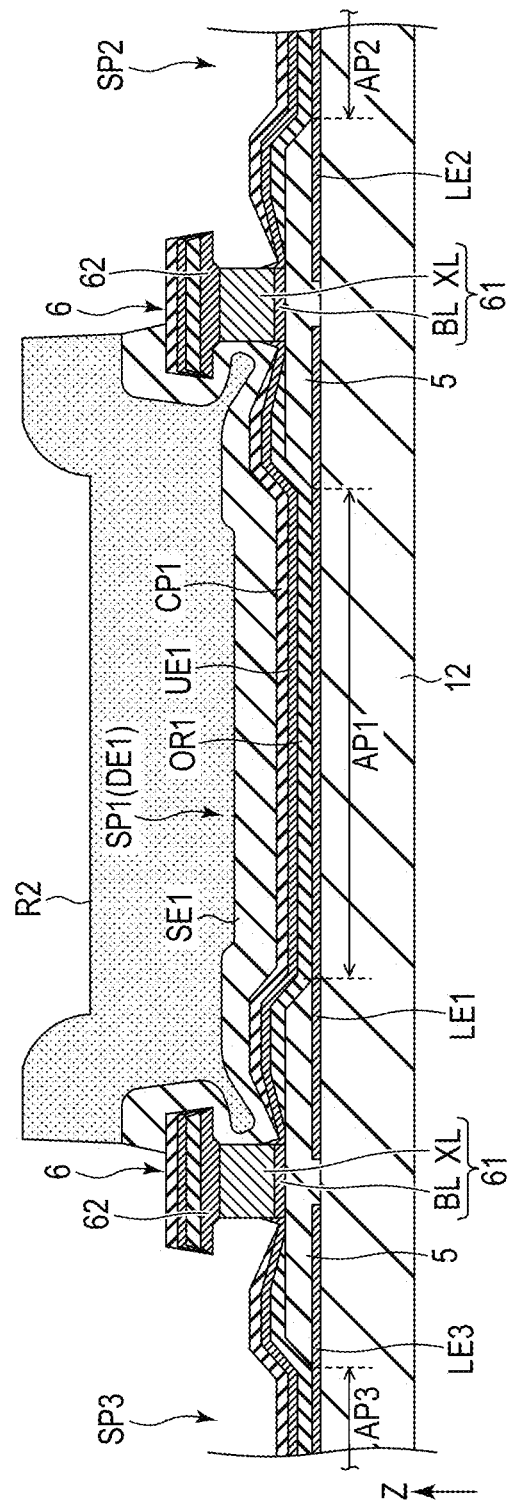
FIG. 20 is a schematic cross-sectional view showing a manufacturing process following FIG. 19.

After that, the portion of the first encapsulation layer SE1, which is exposed from the resist R2, is removed as shown in FIG. 20, by dry etching using the resist R2 as a mask (process P7). The first cap layer CP1 and the first upper electrode UE1 function as stoppers for this dry etching.

Figure 21:
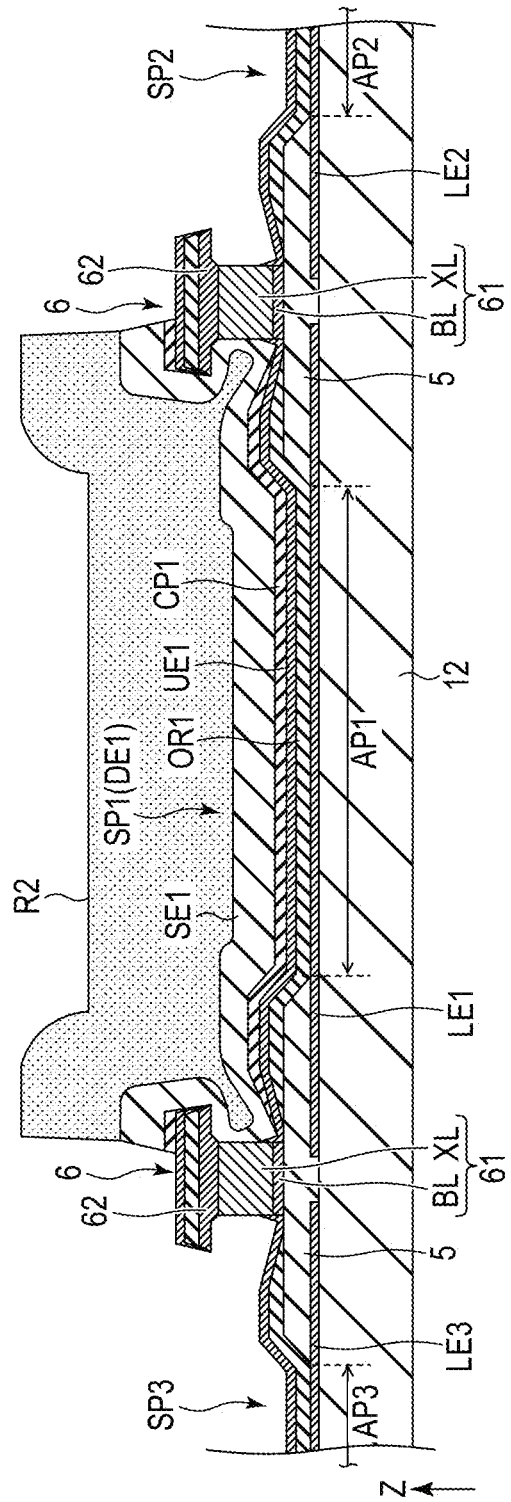
FIG. 21 is a schematic cross-sectional view showing a manufacturing process following FIG. 20.

After process P7, the portion of the first cap layer CP1, which is exposed from the resist R2, is removed as shown in FIG. 21, by etching using the resist R2 as a mask (process P8). For example, when the first cap layer CP1 has a stacked structure, the etching includes wet etching or dry etching for each layer.

Figure 22:
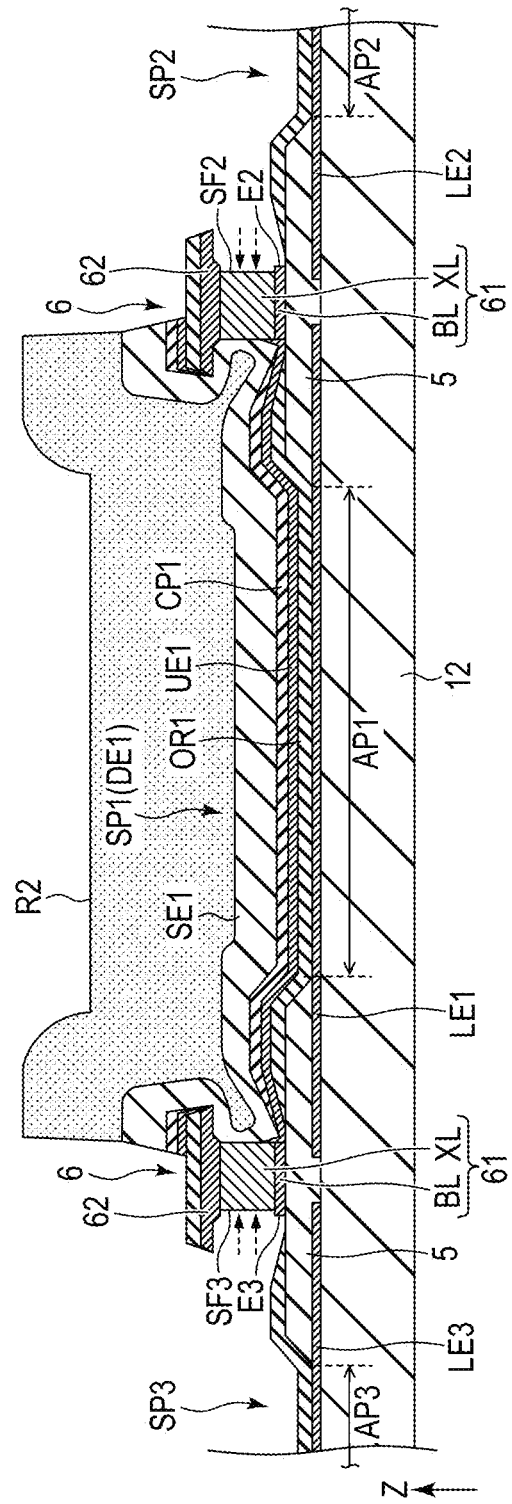
FIG. 22 is a schematic cross-sectional view showing a manufacturing process following FIG. 21.

After process P8, the portion of the first upper electrode UE1, which is exposed from the resist R2, is removed as shown in FIG. 22, by wet etching using the resist R2 as a mask (process P9). The first organic layer OR1 serves as a stopper for this wet etching.

A mixed acid containing phosphoric acid, nitric acid, and acetic acid is used for this wet etching, similarly to the wet etching of the stem layer XL shown in FIG. 16. For this reason, as indicated by arrows of broken lines in FIG. 22, the second side surface SF2 of the stem layer XL of the partition 6 adjacent to the second sub-pixel SP2, and the third side surface SF3 of the stem layer XL of the partition 6 adjacent to the third sub-pixel SP3, are eroded. As a result, the second end portion E2 of the bottom layer BL protrudes from the second side surface SF2, and the third end portion E3 of the bottom layer BL protrudes from the third side surface SF3, as shown in FIG. 4 and FIG. 5.

Figure 23:
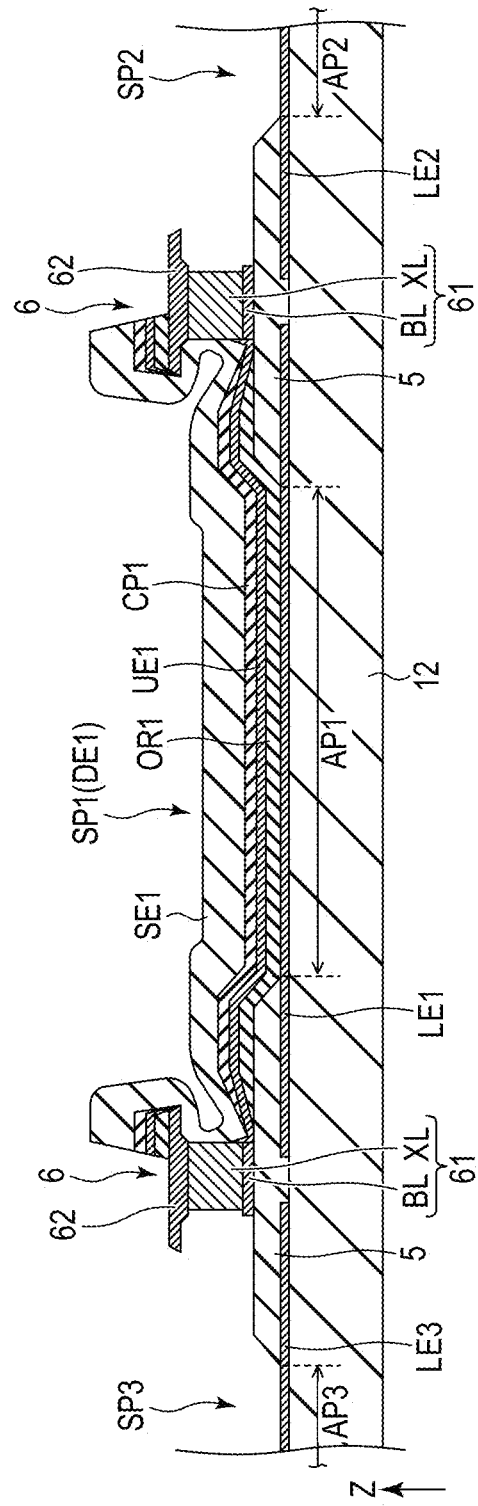
FIG. 23 is a schematic cross-sectional view showing a manufacturing process following FIG. 22.
Figure 24:
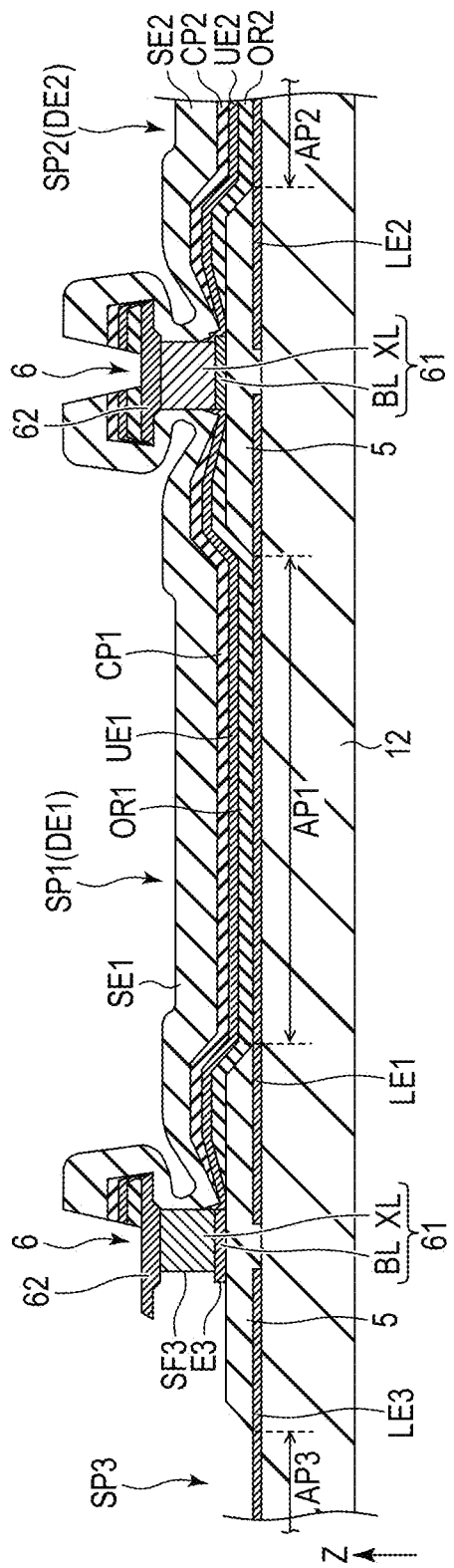
FIG. 24 is a schematic cross-sectional view showing a manufacturing process following FIG. 23.
Figure 25:
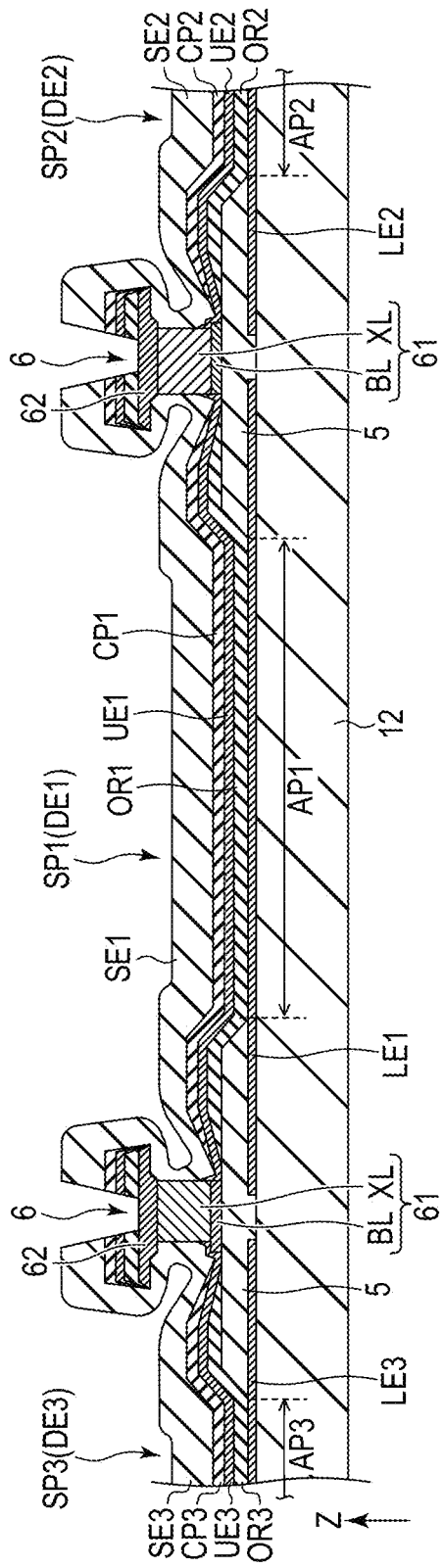
FIG. 25 is a schematic cross-sectional view showing a manufacturing process following FIG. 24.

After process P9, the portion of the first organic layer OR1, which is exposed from the resist R2, is removed by dry etching using the resist R2 as a mask (process P10). After that, the resist R2 is removed (process P11). As a result, as shown in FIG. 23, a substrate in which the first display element DE1 and the first encapsulation layer SE1 are formed in the first sub-pixel SP1 and no display elements or sealing layers are formed in the second sub-pixel SP2 and the third sub-pixel SP3 can be obtained.

The second display element DE2 is formed in the same procedure as the first display element DE1. More specifically, the second organic layer OR2 which is in contact with the second lower electrode LE2 through the second pixel aperture AP2, the second upper electrode UE2 which covers the second organic layer OR2, and the second cap layer CP2 which covers the second upper electrode UE2 are formed in order by vapor deposition (process P12), and the second sealing layer SE2 continuously covering the second cap layer CP2 and the partition 6 is formed by CVD (process P13).

After that, a resist covering the second sub-pixel SP2 and a part of the surrounding partition 6 is arranged similarly to process P6 (process P14). Furthermore, the portion of the second sealing layer SE2, which is exposed from the resist, is removed similarly to process P7 (process P15), the portion of the second cap layer CP2, which is exposed from the resist, is removed similarly to process P8 (process P16), the portion of the second upper electrode UE2, which is exposed from the resist, is removed by the mixed acid similarly to process P9 (process P17), and the portion of the second organic layer OR2, which is exposed from the resist, is removed similarly to process P10 (process P18). After that, the resist is removed (process P19).

After processes P12 to P19 described above, as shown in FIG. 24, a substrate in which the first display element DE1 and the first sealing layer SE1 are formed in the first sub-pixel SP1, the second display element DE2 and the second sealing layer SE2 are formed in the second sub-pixel SP2, and no display elements or sealing layers are formed in the third sub-pixel SP3 can be obtained.

In process P17, the third side surface SF3 of the stem layer XL of the partition 6 adjacent to the third sub-pixel SP3 is eroded by the mixed acid. For this reason, the protrusion length of the third end portion E3 from the third side surface SF3 is greater than the protrusion length of the second edge E2 from the second side surface SF2 as described with reference to FIG. 4 and FIG. 5.

The third display element DE3 is also formed in the same procedure as the first display element DE1. More specifically, the third organic layer OR3 which is in contact with the third lower electrode LE3 through the third pixel aperture AP3, the third upper electrode UE3 which covers the third organic layer OR3, and the third cap layer CP3 which covers the third upper electrode UE3 are formed in order by vapor deposition (process P20), and the third sealing layer SE3 continuously covering the third cap layer CP3 and the partition 6 is formed by CVD (process P21).

After that, a resist covering the third sub-pixel SP3 and a part of the surrounding partition 6 is arranged similarly to process P6 (process P22). Furthermore, the portion of the third sealing layer SE3, which is exposed from the resist, is removed similarly to process P7 (process P23), the portion of the third cap layer CP3, which is exposed from the resist, is removed similarly to process P8 (process P24), the portion of the third upper electrode UE3, which is exposed from the resist, is removed by the mixed acid similarly to process P9 (process P25), and the portion of the third organic layer OR3, which is exposed from the resist, is removed similarly to process P10 (process P26). After that, the resist is removed (process P27).

After processes P20 to P27 described above, as shown in FIG. 25, a substrate in which the first display element DE1 and the first sealing layer SE1 are formed in the first sub-pixel SP1, the second display element DE2 and the second sealing layer SE2 are formed in the second sub-pixel SP2, and the third display element DE3 and the third sealing layer SE3 are formed in the third sub-pixel SP3 can be obtained.

After process P27, the resin layer 13, the sealing layer 14, and the resin layer 15 shown in FIG. 3 are formed in order (process P28). The display device DSP is thereby completed.

In the above-described embodiment, the bottom layer BL of the partition 6 is formed of a material whose etching rate to a mixed acid containing phosphoric acid, nitric acid, and acetic acid is smaller than that of the stem layer XL. If the etching rate of the bottom layer BL for the mixed acid is large, the bottom layer BL can be eroded during wet etching of the first upper electrode UE1 in process P9 and the second upper electrode UE2 in process P17. If the erosion of the bottom layer BL is significant, the second upper electrode UE2 and the third upper electrode UE3 may not be brought into contact with the lower portion 61 of the partition 6, resulting in conduction failure.

In contrast, in the configuration of the present embodiment, the bottom layer BL is not easily eroded by the mixed acid. Therefore, the second upper electrode UE2 and the third upper electrode UE3 can be brought into contact with the bottom layer BL and the conduction failure can be suppressed.

In addition, in the present embodiment, the upper portion 62 (first layer L1) is also formed of a material which is hardly eroded by the mixed acid. For this reason, the protrusion length of the upper portion 62 from the lower portion 61, i.e., the distance from the edge of the bottom layer BL to the edge of the upper portion 62 can easily be controlled. The organic layers OR1, OR2, and OR3, the upper electrodes UE1, UE2, and UE3, and the cap layers CP1, CP2, and CP3 can be desirably divided by the partition 6 by setting the protrusion length to an appropriate value.

In the examples of FIG. 4 and FIG. 5, the upper portion 62 includes the first layer L1 and the second layer L2. Furthermore, the second layer L2 is formed of a material whose etching rate to dry etching using fluorine gas is smaller than that of the first layer L1 and the bottom layer BL. In this configuration, even if the first layer L1 is significantly eroded by etching of other layers, the shape of the overhanging upper portion 62 can be maintained by the second layer L2.

In addition, as shown in FIG. 17, if the first layer L1 (third metal layer M3) is formed to be thicker in consideration that the lower surface of the first layer L1 is eroded in the dry etching of the first metal layer M1, the loss of the first layer L1 can be prevented.

In addition to the above, various suitable advantages can be obtained from the present embodiment.

Second Embodiment

Figure 26:
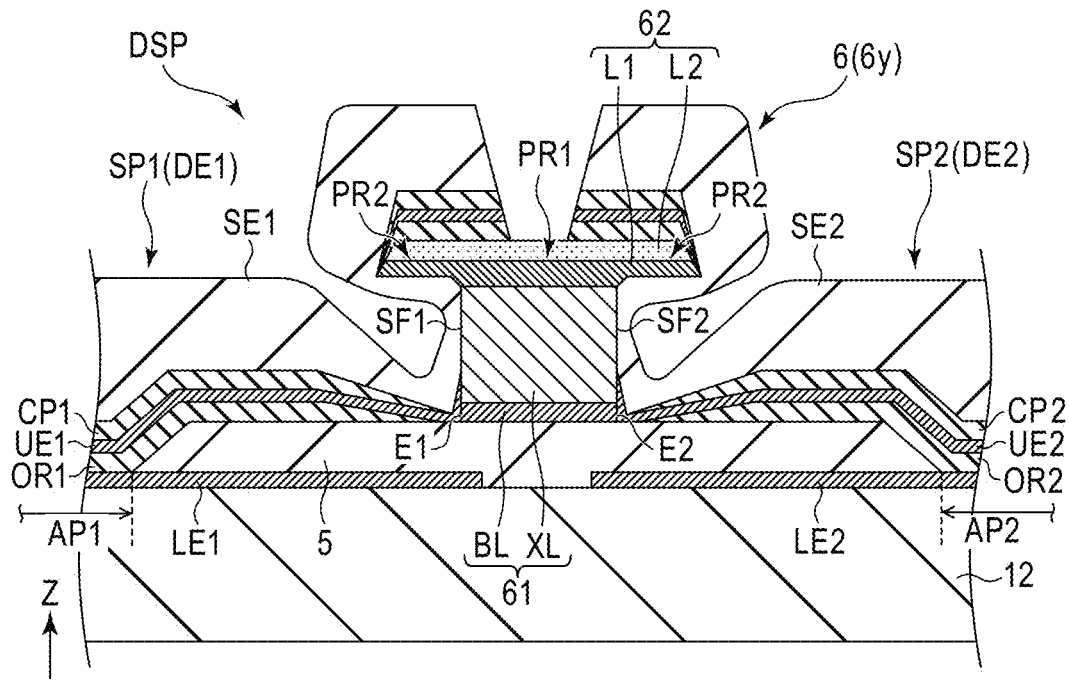
FIG. 26 is a schematic cross-sectional view showing an example of a display device of a second embodiment.
Figure 27:
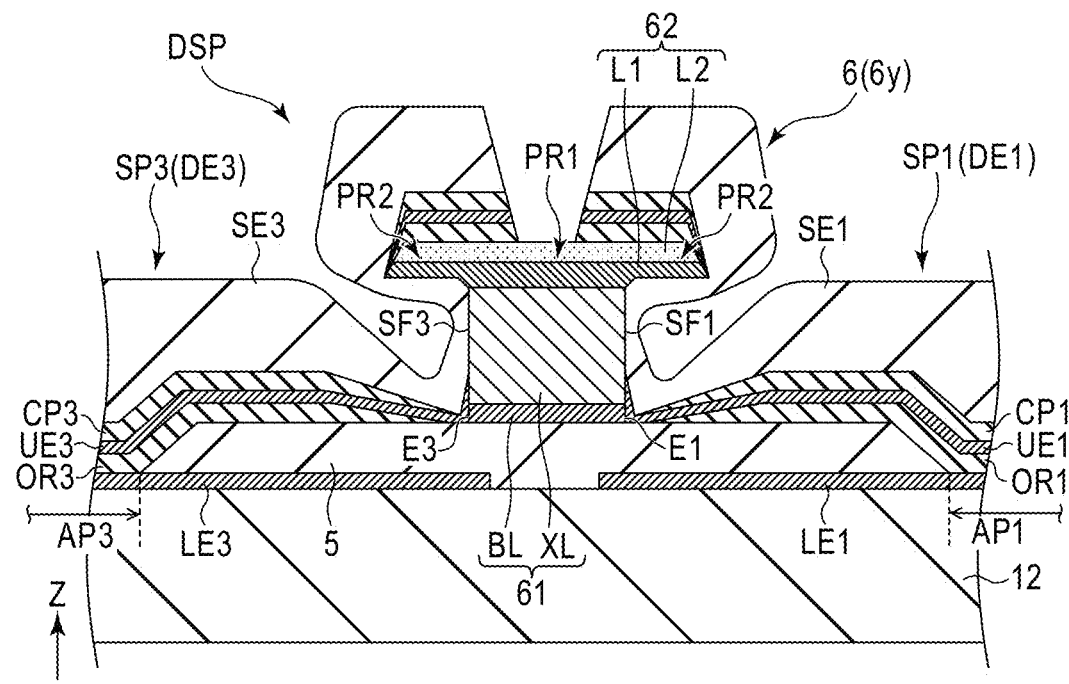
FIG. 27 is a schematic cross-sectional view showing an example of the display device of the second embodiment.

FIG. 26 and FIG. 27 are schematic cross-sectional views showing an example of a display device DSP of a second embodiment. FIG. 26 shows a structure of a partition 6 between pixel apertures AP1 and AP2 and its vicinity, similarly to FIG. 4, and FIG. 27 shows the partition 6 between the pixel apertures AP1 and AP3 and its vicinity, similarly to FIG. 5.

In the present embodiment, too, a first edge E1 of a bottom layer BL is aligned with a first side surface SF1 of a stem layer XL in the third direction Z, similarly to the examples of FIG. 4 and FIG. 5. Furthermore, as shown in FIG. 26, a second end portion E2 of the bottom layer BL is aligned with a second side surface SF2 of the stem layer XL in the third direction Z, in the present embodiment. In other words, the second end portion E2 and the second side surface SF2 form a substantially continuous plane. In addition, as shown in FIG. 27, a third end portion E3 of the bottom layer BL is aligned with a third side surface SF3 of the stem layer XL in the third direction Z. In other words, the third end portion E3 and the third side surface SF3 form a substantially continuous plane.

The structure of the display device DSP other than the portions shown in FIG. 26 and FIG. 27, the manufacturing method of the display device DSP, and the advantages achieved therefrom are the same as those of the first embodiment.

Third Embodiment

FIG. 28 and FIG. 29 are schematic cross-sectional views showing an example of a display device DSP of a third embodiment. FIG. 28 shows a structure of a partition 6 between pixel apertures AP1 and AP2 and its vicinity, similarly to FIG. 4, and FIG. 29 shows the partition 6 between the pixel apertures AP1 and AP3 and its vicinity, similarly to FIG. 5.

In the present embodiment, a first edge E1 of a bottom layer BL protrude further than a first side surface SF1 of a stem layer XL in the width direction, as shown in FIG. 28 and FIG. 29. A first upper electrode UE1 entirely covers the portion of the bottom layer BL, which protrudes from the first side surface SF1, and is also in contact with the first side surface SF1. Similarly to the examples of FIG. 4 and FIG. 5, a second end portion E2 and a third end portion E3 of the bottom layer BL protrude from a second side surface SF2 and a third side surface SF3 of the stem layer XL, respectively.

In the examples of FIG. 28 and FIG. 29, a protrusion length D1 of the first end portion E1 from the first side surface SF1, a protrusion length D2 of the second end portion E2 from the second side surface SF2, and a protrusion length D3 of the third end portion E3 from the third side surface SF3 are equivalent (D1=D2=D3).

Figure 30:
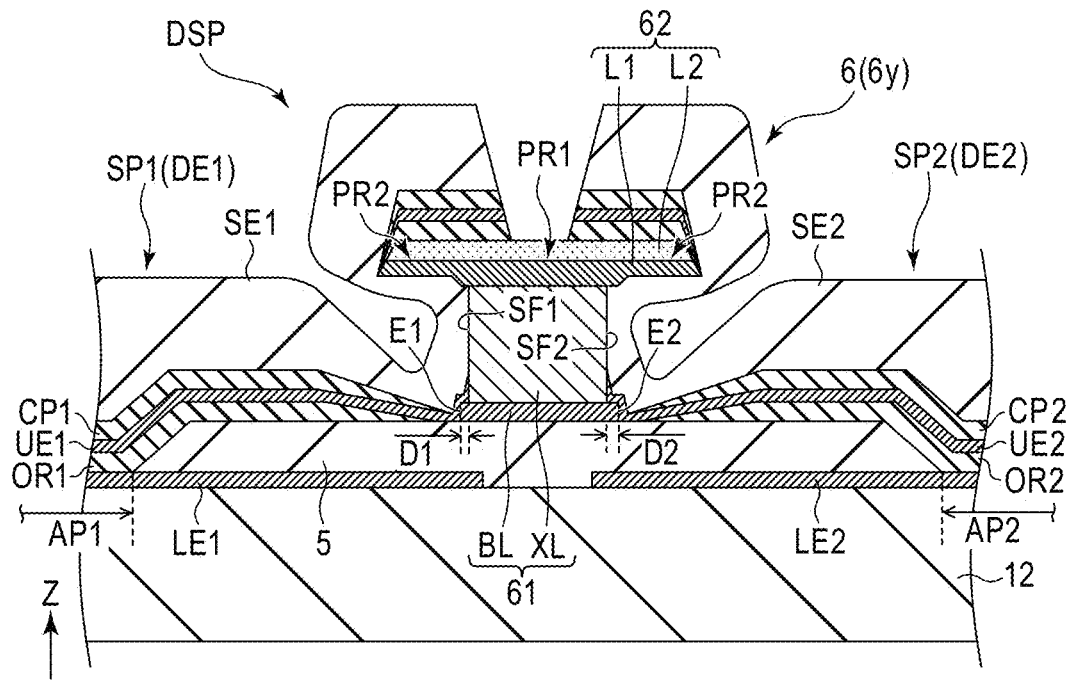
FIG. 30 is a schematic cross-sectional view showing another example of the display device of the third embodiment.
Figure 31:
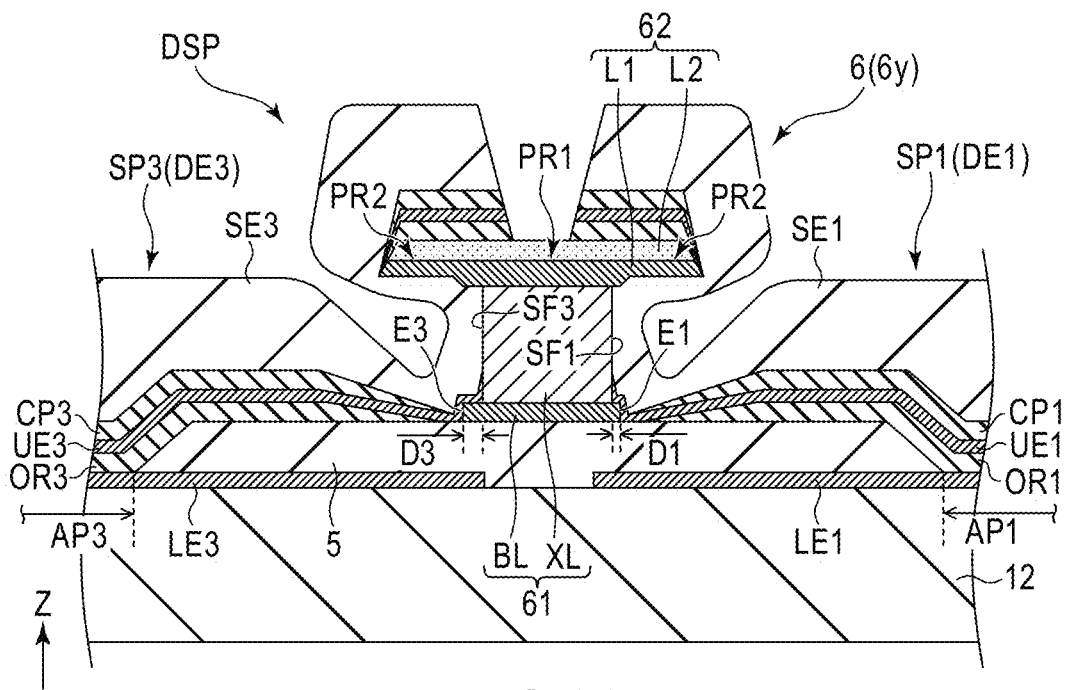
FIG. 31 is a schematic cross-sectional view showing yet another example of the display device of the third embodiment.

FIG. 30 and FIG. 31 are schematic cross-sectional views showing another example of the display device DSP of the present embodiment. FIG. 30 shows a structure of a partition 6 between pixel apertures AP1 and AP2 and its vicinity, similarly to FIG. 4, and FIG. 31 shows the partition 6 between the pixel apertures AP1 and AP3 and its vicinity, similarly to FIG. 5.

In the examples of FIG. 30 and FIG. 31, the protrusion lengths D1, D2, and D3 are different from each other. More specifically, the protrusion length D2 is larger than the protrusion length D1, and the protrusion length D3 is larger than the protrusion length D2 (D1<D2<D3).

When the first end portion E1 and the first side surface SF1 are aligned in the third direction Z, as shown in FIG. 4, FIG. 5, FIG. 26, and FIG. 27, the protrusion length D1 can be considered zero. In addition, when the ends E1, E2, and E3 are aligned with the side surfaces SF1, SF2, and SF3 in the third direction Z, respectively, as shown in FIG. 26 and FIG. 27, all the protrusion lengths D1, D2, and D3 can be considered zero.

The structure of the display device DSP other than the portions shown in FIG. 28 to FIG. 31, the manufacturing method of the display device DSP, and the advantages achieved therefrom are the same as those of the first embodiment. Furthermore, in the present embodiment, since the ends E1, E2, and E3 protrude from the side surfaces SF1, SF2, and SF3, respectively, the contact area of the upper electrodes UE1, UE2, and UE3 and the ends E1, E2, and E3 is increased. As a result, desirable conduction between the upper electrodes UE1, UE2, and UE3 and the bottom layer BL can be secured.

Fourth Embodiment

The manufacturing method of the display device DSP is not limited to that described in the first embodiment using the flowchart of FIG. 10. Next, another example of the method of manufacturing the display device DSP will be described.

Figure 32:
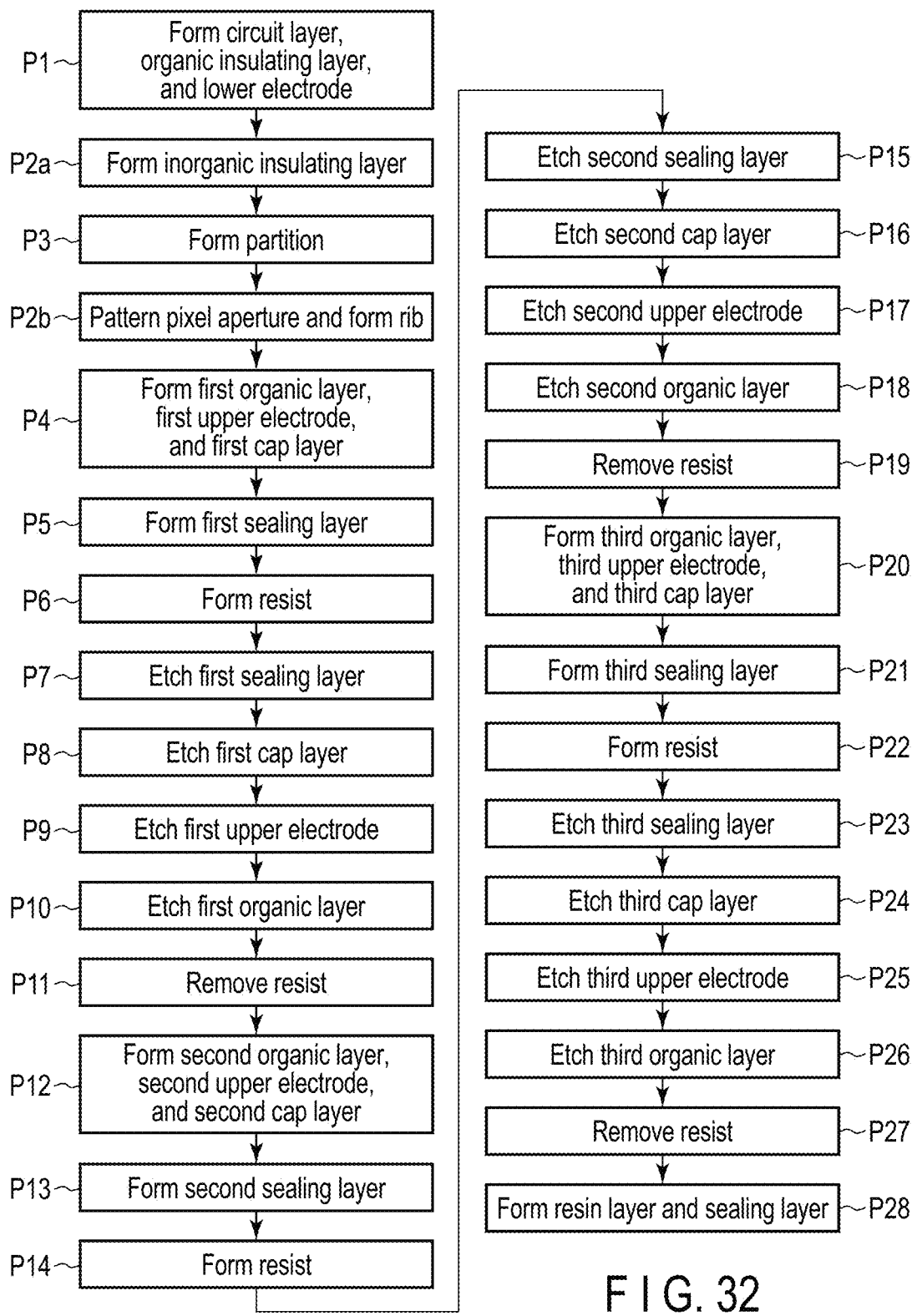
FIG. 32 is a flowchart showing an example of a method of manufacturing a display device of a fourth embodiment.

FIG. 32 is a flowchart showing an example of a method of manufacturing a display device DSP of a fourth embodiment. In this flowchart, a circuit layer 11, an organic insulating layer 12, and lower electrodes LE1, LE2, and LE3 are first formed on a substrate 10, similarly to the first embodiment (process P1). Next, an inorganic insulating layer 5', which is processed into the rib 5, is formed (process P2a). At this time, pixel apertures AP1, AP2, and AP3 are not provided in this inorganic insulating layer 5'.

After process P2a, a partition 6 is formed on the inorganic insulating layer 5' (process P3). A method of forming the partition 6 has been described above with reference to FIG. 13 to FIG. 17. After the formation of the partition 6, a rib 5 is formed by patterning the pixel apertures AP1, AP2, and AP3 on the inorganic insulating layer 5' (process P2b). After process P2b, processes P4 to P28 are executed similarly to the first embodiment.

The structure of the display device DSP manufactured by such a manufacturing method and the advantages achieved by the display device DSP are the same as those in the first embodiment. Furthermore, when the pixel apertures AP1, AP2, and AP3 are formed after forming the partition 6 similarly to the present embodiment, the lower electrodes LE1, LE2, and LE3 can be protected from etching executed when the partition 6 is formed.

All of the display devices and manufacturing methods that can be implemented by a person of ordinary skill in the art through arbitrary design changes to the display devices and manufacturing methods described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

A summary of the manufacturing method described in the above embodiments is provided below.

(1) A display device manufacturing method including:
  forming a first lower electrode and a second lower electrode;
  forming a rib including a first pixel aperture overlapping with the first lower electrode and a second pixel aperture overlapping with the second lower electrode;
  forming a partition including a lower portion arranged on the rib and an upper portion protruding from a side surface of the lower portion;
  forming a first organic layer contacting with the first lower electrode through the first pixel aperture;
  forming a first upper electrode covering the first organic layer;
  forming a first resist above a first display element including the first lower electrode, the first organic layer, and the first upper electrode;
  removing a portion of the first upper electrode, which is exposed from the first resist, by wet etching using a mixed acid containing phosphoric acid, nitric acid, and acetic acid;
  removing a portion of the first organic layer, which is exposed from the first resist, by dry etching;
  forming a second organic layer contacting with the second lower electrode through the second pixel aperture; and
  forming a second upper electrode covering the second organic layer,
  wherein
  the lower portion includes a bottom layer contacting with the first upper electrode and the second upper electrode and a stem layer arranged on the bottom layer, and
  the bottom layer is formed of a material which has a smaller etching rate to the mixed acid than the stem layer and which is conductive.

(2) The method of above item (1), wherein
  the upper portion is formed of a material whose etching rate to the mixed acid is smaller than an etching rate of the stem layer.

(3) The method of above item (1), wherein
  the forming the partition includes:
  forming a first metal layer on the rib;
  forming a second metal layer covering the first metal layer;
  forming a third metal layer covering the second metal layer;
  forming a second resist above the third metal layer;
  removing a portion of the third metal layer, which is exposed from the second resist, to form the upper portion, and removing a portion of the second metal layer, which is exposed from the second resist, to form the stem layer, by dry etching;
  reducing a width of the stem layer by wet etching; and
  removing a portion of the first metal layer, which is exposed from the stem layer, to form the bottom layer, by dry etching.

(4) The method of above item (1), wherein
  the stem layer is formed of aluminum or an aluminum alloy, and
  the bottom layer is formed of titanium, titanium nitride, tungsten, or a tungsten alloy.

What is claimed is:
1. A display device comprising:
a first lower electrode and a second lower electrode;
a rib including a first pixel aperture overlapping with the first lower electrode and a second pixel aperture overlapping with the second lower electrode;

a partition including a lower portion arranged on the rib between the first pixel aperture and the second pixel aperture, and an upper portion protruding from a side surface of the lower portion;
a first upper electrode opposed to the first lower electrode;
a second upper electrode opposed to the second lower electrode;
a first organic layer located between the first lower electrode and the first upper electrode to emit light;
a second organic layer located between the second lower electrode and the second upper electrode to emit light;
a first sealing layer covering the first upper electrode; and
a second sealing layer covering the second upper electrode,
wherein
the rib is formed of a first inorganic material,
the first sealing layer and the second sealing layer are formed of a second inorganic material that is different from the first inorganic material,
a first end part of the first sealing layer and a second end part of the second sealing layer are located above the upper portion of the partition,
the lower portion includes a conductive bottom layer and a stem layer which is formed of a metal and is arranged on the conductive bottom layer,
the conductive bottom layer includes a first end on a side of the first pixel aperture and a second end on a side of the second pixel aperture,
the stem layer includes a first side surface on a side of the first pixel aperture and a second side surface on a side of the second pixel aperture, and
the first end protrudes from the first side surface, and the second end protrudes from the second side surface.

2. The display device of claim 1, wherein
the rib is formed of silicon oxide or silicon oxynitride, and
the first sealing layer and the second sealing layer are formed of silicon nitride.

3. The display device of claim 1, wherein
a protrusion length of the first end from the first side surface is different from a protrusion length of the second end from the second side surface.

4. The display device of claim 1, wherein
a protrusion length of the first end from the first side surface and a protrusion length of the second end from the second side surface are the same.

5. The display device of claim 1, wherein
the stem layer is formed of aluminum or an aluminum alloy.

6. The display device of claim 1, wherein
the stem layer includes a plurality of layers formed of aluminum or an aluminum alloy.

7. The display device of claim 1, wherein
the conductive bottom layer is formed of titanium, titanium nitride, tungsten, or a tungsten alloy.

8. The display device of claim 1, wherein
the conductive bottom layer includes a plurality of layers formed of titanium, titanium nitride, tungsten, or a tungsten alloy.

9. The display device of claim 1, wherein
the upper portion is formed of a material including titanium, titanium nitride, tungsten, or a tungsten alloy.

10. The display device of claim 1, wherein
the upper portion is formed to be thicker than the conductive bottom layer.

11. The display device of claim 1, wherein
the first upper electrode is in contact with the first end, and the second upper electrode is in contact with the second end.

12. A display device comprising:
a first lower electrode and a second lower electrode;
a rib including a first pixel aperture overlapping with the first lower electrode and a second pixel aperture overlapping with the second lower electrode;
a partition including a lower portion arranged on the rib and an upper portion protruding from a side surface of the lower portion;
a first upper electrode opposed to the first lower electrode;
a second upper electrode opposed to the second lower electrode;
a first organic layer located between the first lower electrode and the first upper electrode to emit light;
a second organic layer located between the second lower electrode and the second upper electrode to emit light;
a first sealing layer covering the first upper electrode; and
a second sealing layer covering the second upper electrode,
wherein
the partition is arranged between the first pixel aperture and the second pixel aperture,
the rib is formed of an inorganic material,
the upper portion includes a first layer and a second layer covering the first layer,
the first layer is formed of a first metal,
the second layer is formed of a transparent conductive material,
a first end part of the first sealing layer and a second end part of the second sealing layer are located above the upper portion of the partition,
the lower portion includes a conductive bottom layer and a stem layer which is formed of a second metal that is different from the first metal and is arranged on the conductive bottom layer, the conductive bottom layer includes a first end on a side of the first pixel aperture and a second end on a side of the second pixel aperture,
the stem layer includes a first side surface on a side of the first pixel aperture and a second side surface on a side of the second pixel aperture, and
the first end protrudes from the first side surface, and the second end protrudes from the second side surface.

13. The display device of claim 12, wherein
the first upper electrode is in contact with the first end, and the second upper electrode is in contact with the second end.

14. The display device of claim 12, wherein
a protrusion length of the first end from the first side surface is different from a protrusion length of the second end from the second side surface.

15. The display device of claim 12, wherein
a protrusion length of the first end from the first side surface and a protrusion length of the second end from the second side surface are the same.

16. The display device of claim 12, wherein:
the conductive bottom layer is formed of titanium, titanium nitride, tungsten, or a tungsten alloy, and the rib is formed of silicon oxide or silicon oxynitride.

17. The display device of claim 12, wherein
the upper portion is formed to be thicker than the conductive bottom layer.

18. The display device of claim 12, wherein
the rib includes a first rib layer formed of silicon nitride, and a second rib layer which is formed of silicon oxide or silicon oxynitride and covers the first rib layer.

19. A display device comprising:
a first lower electrode and a second lower electrode;
a rib including a first pixel aperture overlapping with the first lower electrode and a second pixel aperture overlapping with the second lower electrode;
a partition including a lower portion arranged on the rib and an upper portion protruding from a side surface of the lower portion;
a first upper electrode opposed to the first lower electrode;
a second upper electrode opposed to the second lower electrode;
a first organic layer located between the first lower electrode and the first upper electrode to emit light;
a second organic layer located between the second lower electrode and the second upper electrode to emit light;
a first sealing layer covering the first upper electrode; and
a second sealing layer covering the second upper electrode,
wherein
the partition is arranged between the first pixel aperture and the second pixel aperture,
the rib is formed of an inorganic material,
the upper portion includes a first layer and a second layer covering the first layer,
the first layer is formed of a first metal,
the second layer is formed of a transparent conductive material,
a first end part of the first sealing layer and a second end part of the second sealing layer are located above the upper portion of the partition,
the lower portion includes a conductive bottom layer that is formed of the first metal and a stem layer that is formed of a second metal that is different from the first metal and that is arranged on the conductive bottom layer, the conductive bottom layer includes a first end on a side of the first pixel aperture and a second end on a side of the second pixel aperture,
the stem layer includes a first side surface on a side of the first pixel aperture and a second side surface on a side of the second pixel aperture, and
the first end protrudes from the first side surface, and the second end protrudes from the second side surface.

20. The display device of claim 19, wherein
the first upper electrode is in contact with the first end, and the second upper electrode is in contact with the second end.

21. The display device of claim 20, wherein
a protrusion length of the first end from the first side surface is different from a protrusion length of the second end from the second side surface.

22. The display device of claim 20, wherein
a protrusion length of the first end from the first side surface and a protrusion length of the second end from the second side surface are the same.

23. The display device of claim 20, wherein:
the conductive bottom layer is formed of titanium, titanium nitride, tungsten, or a tungsten alloy; and the rib is foil led of silicon oxide or silicon oxynitride.

24. The display device of claim 20, wherein
the upper portion is formed to be thicker than the conductive bottom layer.

25. The display device of claim 20, wherein
the rib includes a first rib layer formed of silicon nitride, and a second rib layer which is formed of silicon oxide or silicon oxynitride and covers the first rib layer.

* * * * *